(12) United States Patent
Perez Martinez

(10) Patent No.: US 10,225,376 B2
(45) Date of Patent: Mar. 5, 2019

(54) METHODS AND NETWORK NODES FOR COMPRESSION AND DECOMPRESSION OF DATA PACKETS

(71) Applicant: Telefonaktiebolaget LM Ericsson (Publ), Stockholm (SE)

(72) Inventor: Alfonzo de Jesus Perez Martinez, Madrid (ES)

(73) Assignee: Telefonaktiebolaget LM Ericsson (Publ), Stockholm (SE)

(*) Notice: Subject to any disclaimer, the term of this patent is extended or adjusted under 35 U.S.C. 154(b) by 361 days.

(21) Appl. No.: 15/034,099

(22) PCT Filed: Nov. 6, 2013

(86) PCT No.: PCT/EP2013/073166
§ 371 (c)(1),
(2) Date: May 3, 2016

(87) PCT Pub. No.: WO2015/067311
PCT Pub. Date: May 14, 2015

(65) Prior Publication Data
US 2016/0286008 A1    Sep. 29, 2016

(51) Int. Cl.
*H04L 29/06* (2006.01)
*H03M 7/30* (2006.01)
(Continued)

(52) U.S. Cl.
CPC .......... *H04L 69/04* (2013.01); *H03M 7/3084* (2013.01); *H04L 12/1407* (2013.01); *H04L 43/028* (2013.01)

(58) Field of Classification Search
CPC ... H04L 69/04; H04L 12/1407; H04L 43/028; H03M 7/3084
See application file for complete search history.

(56) References Cited

U.S. PATENT DOCUMENTS

| | | | |
|---|---|---|---|
| 2013/0114626 A1 | 5/2013 | Bellessort et al. | |
| 2014/0198789 A1* | 7/2014 | Kim ........................ | H04L 69/04 370/392 |
| 2015/0161156 A1* | 6/2015 | Zhuang ............. | G06F 17/30159 707/693 |

OTHER PUBLICATIONS

International Search Report and Written Opinion dated Jan. 13, 2014 for International Application No. PCT/EP2013/073166, International Filing Date Nov. 6, 2013 consisting of 9-pages.
(Continued)

*Primary Examiner* — Melvin C Marcelo
(74) *Attorney, Agent, or Firm* — Christopher & Weisberg, P.A.

(57) ABSTRACT

Methods for compressing and decompressing data packets. A data packet is classified as related to an Internet service and a function is determined that the classified data packet is intended to accomplish for the Internet service. A state that corresponds to the classified data packet is determined based on a state-machine and one or more states of the state-machine. The state-machine and the one or more states are associated with the determined function in a conversion file. Compression is achieved by detecting in the classified data packet a data pattern associated with the determined state in the conversion file and replacing the data pattern with a token associated with the detected data pattern in the conversion file. Decompression is achieved by detecting a token associated with the determined state in the conversion file and replacing the token with a data pattern associated with the token in the conversion file.

38 Claims, 23 Drawing Sheets

(51) Int. Cl.
*H04L 12/14* (2006.01)
*H04L 12/26* (2006.01)

(56) References Cited

OTHER PUBLICATIONS

J. Case et al., Network Working Group, Request for Comments: 1444, Title: "Conformance Statements for version 2 of the Simple Network Management Protocol (SNMPv2)", Apr. 1993 consisting of 33-pages.

Mun Choon Chan et al, "Cache-Based Compaction; A New Technique for Optimizing Web Transfer", Proceedings of the Eighteenth Annual Joint Conference of the IEEE Computer and Communications Societies, (INFOCOM '99), vol. 1 (117-125), Location and Date of Conference: New York, New York, Mar. 21-25, 1999 consisting of 9-pages.

A. Shacham, et al., Network Working Group, Request for Comments: 3173, Obsoletes: 2393, Title: "IP Payload Compression Protocol (IPComp)", Category: Standards Track, Sep. 2001 consisting of 13-pages.

John Butler et al, "A Proposal for Shared Dictionary Compression over HTPP", Sep. 8, 2008 consisting of pp. 1-17.

3GPP TS 23.203 V9A.0 (Mar. 2010) 3rd Generation Partnership Project; Technical Specification Group Services and System Aspects; Policy and Charging Control Architecture (Release 9) Mar. 26, 2010 consisting of 123-pages.

3GPP TS 29.212 V9.2.0 (Mar. 2010) 3rd Generation Partnership Project; Technical Specification Group Core Network and Terminals; Policy and Charging Control over Gx Reference Point (Release 9) Apr. 2, 2010 contains 111-pages.

Anat Bremler-Barr et al, "Decompression-Free Inspection: DPI for Shared Dictionary Compression over HTTP", Proceedings of the IEEE (INFOCOM 2012), pp. 1987-1995, Conference Location and Date: Orlando, Fl, USA, Mar. 25-30, 2012 consisting of 10-pages.

* cited by examiner

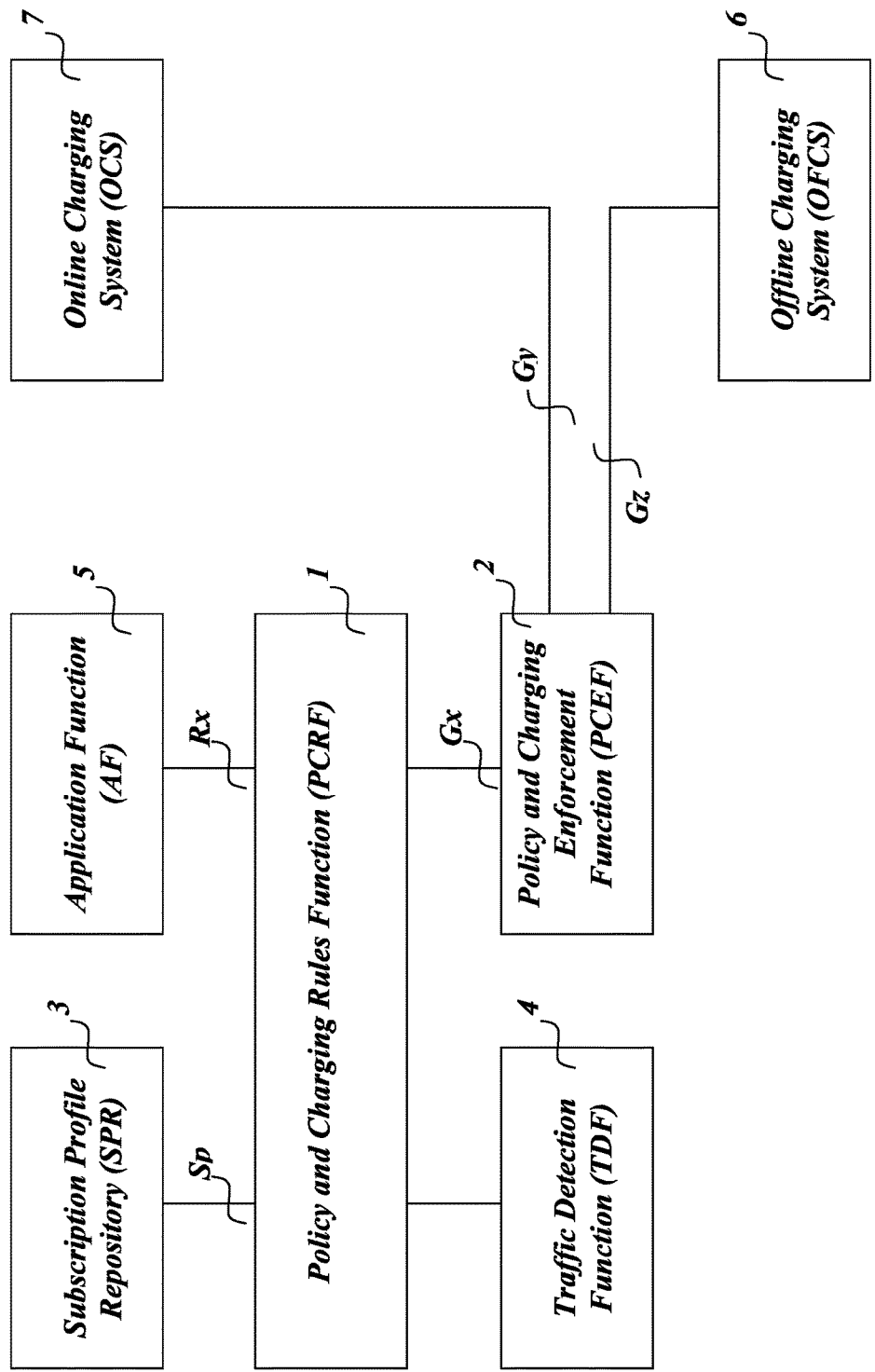
FIG. -1-

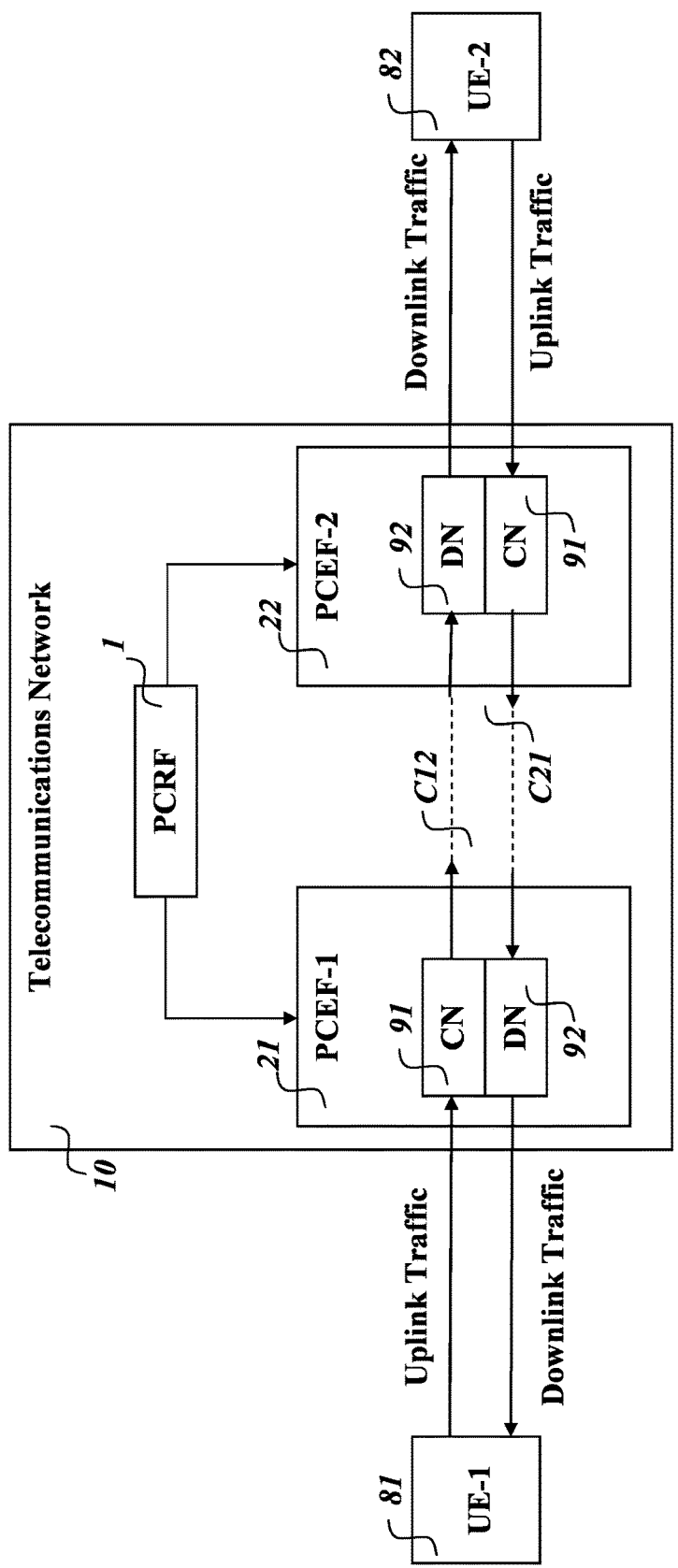
FIG. -2-

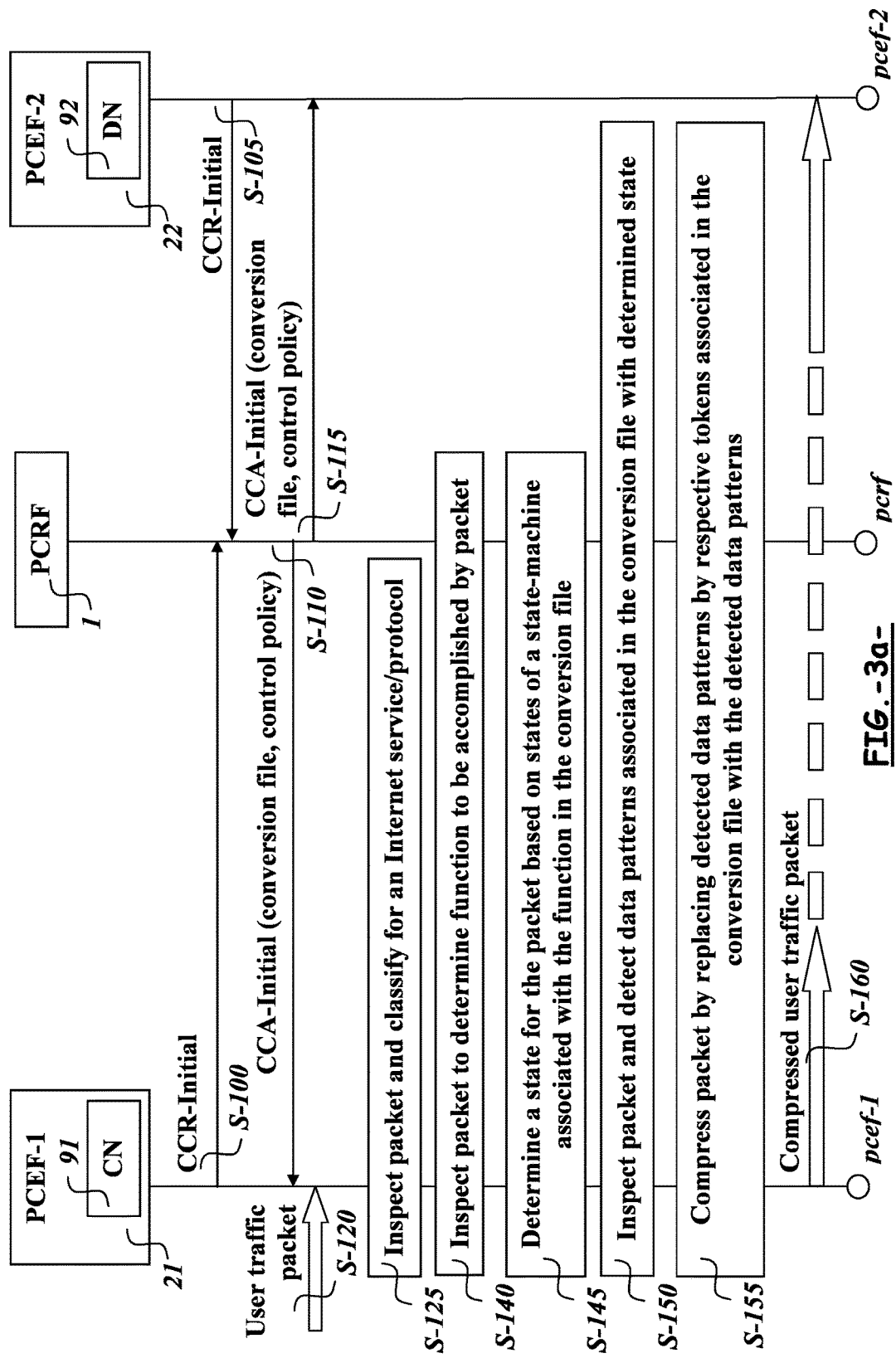
FIG. -3a-

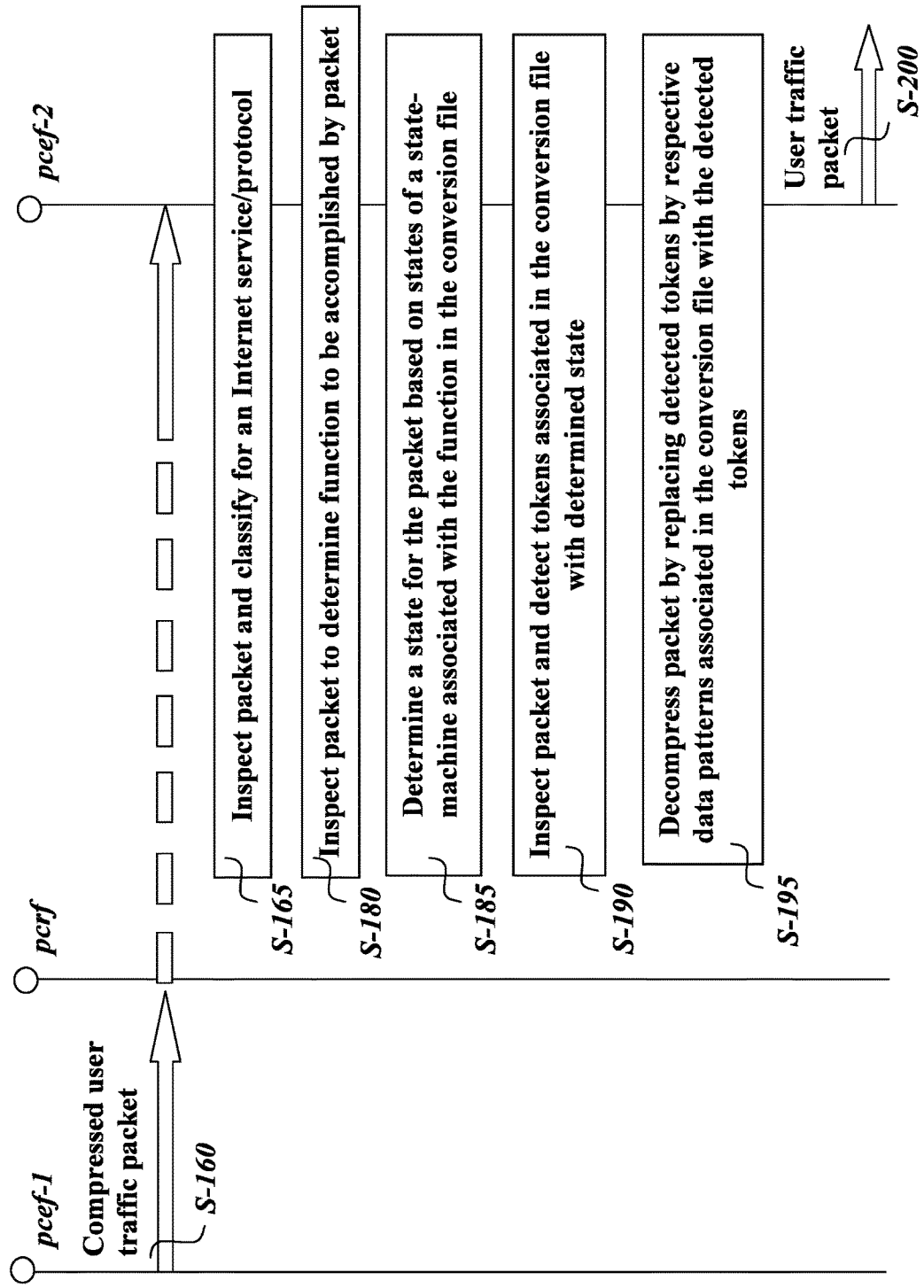
FIG. -3b-

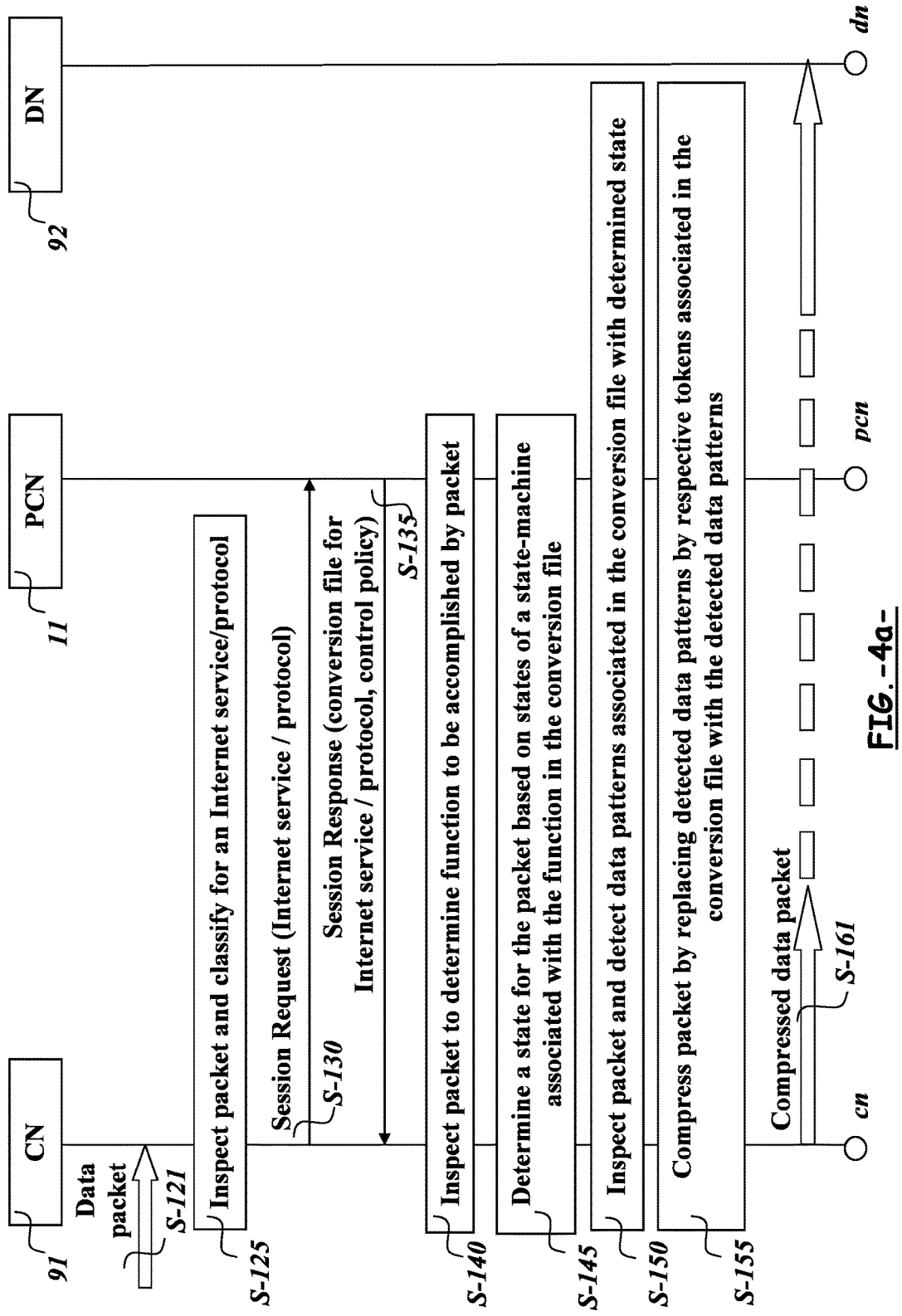
FIG. -4a-

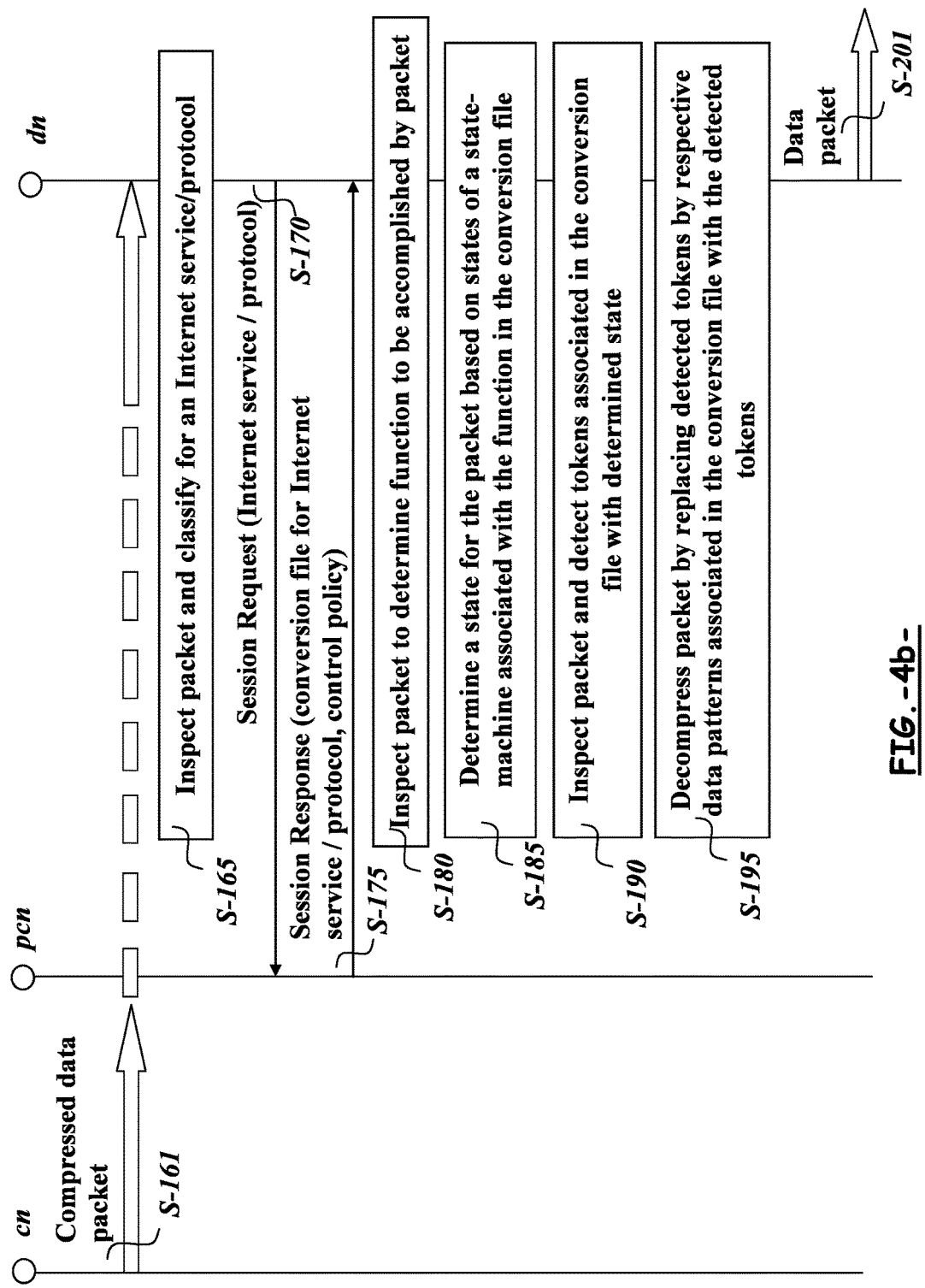
FIG. -4b-

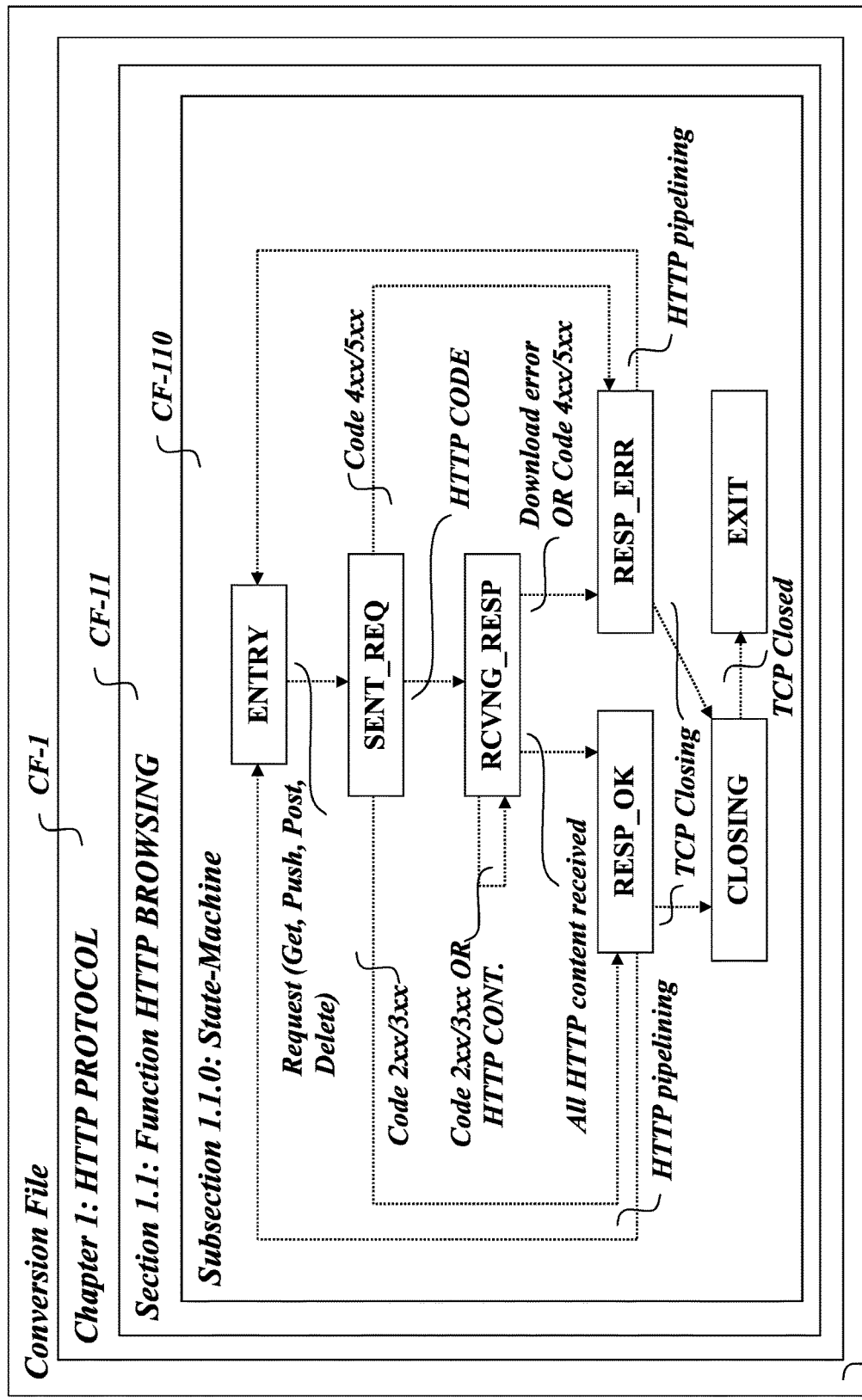
FIG. -5a-

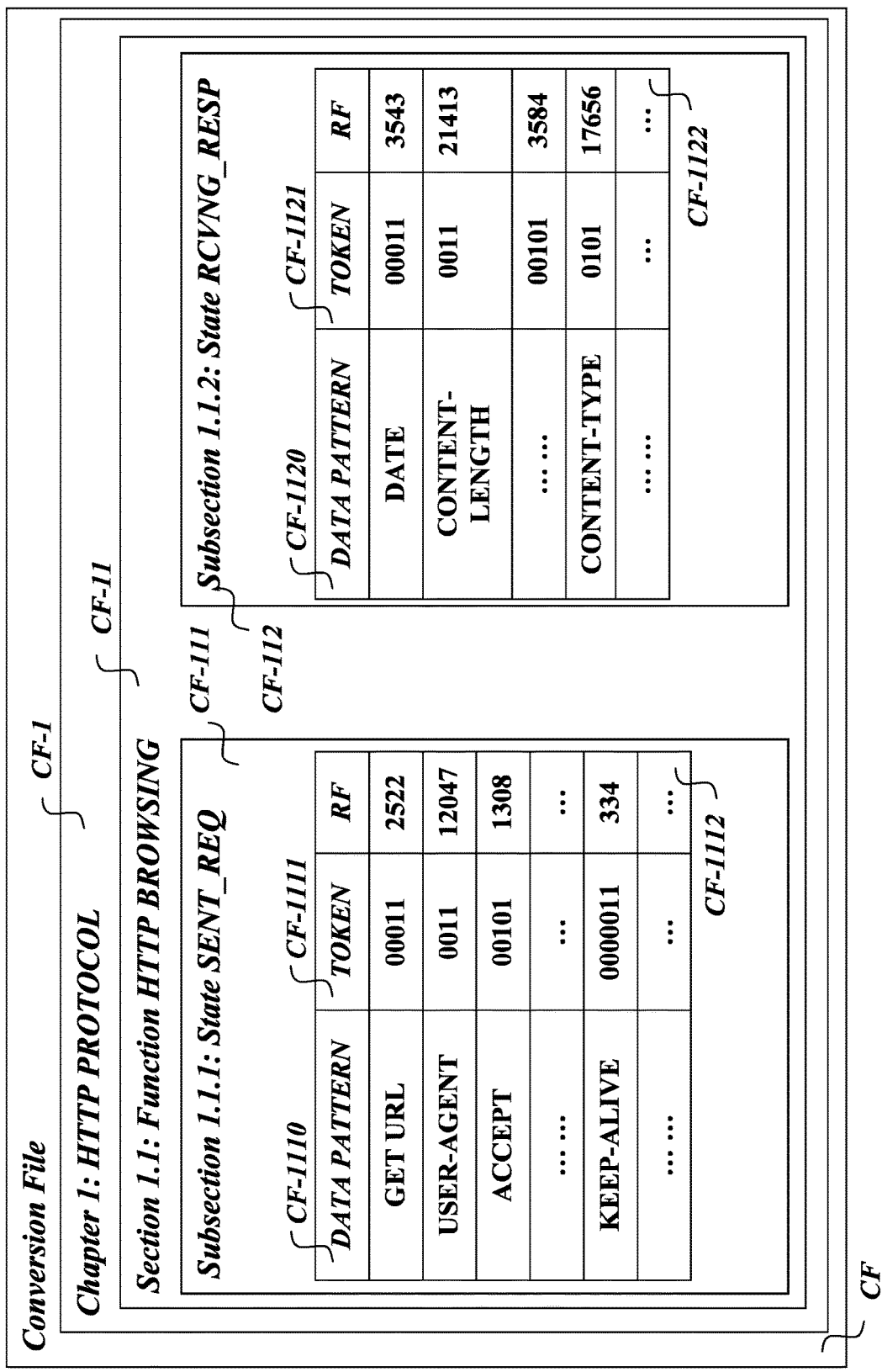
FIG. -5b-

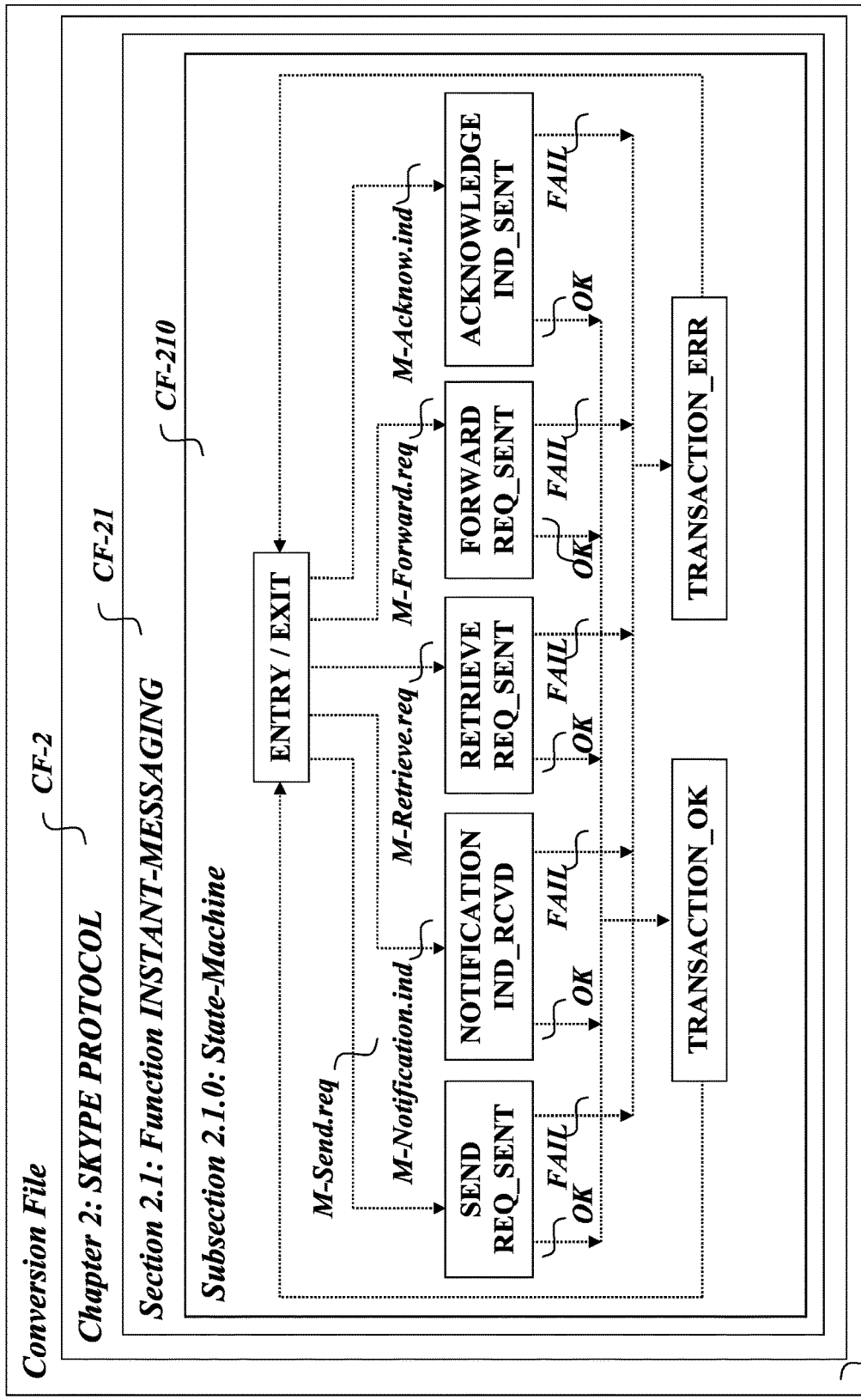
FIG. -6a-

*Conversion File* — CF

Chapter 2: SKYPE PROTOCOL — CF-2

Section 2.1: Function INSTANT-MESSAGING — CF-21

Subsection 2.1.1: State SEND_REQ_SENT — CF-211 / CF-212

CF-2110

| DATA PATTERN | TOKEN | RF |
|---|---|---|
| Pattern -0 | 00011 | 1500 |
| Pattern -1 | 00101 | 1600 |
| Pattern -2 | 00110 | 1700 |
| ...... | ... | ... |
| Pattern -i | 0101000 | 97 |
| ...... | ... | ... |
| Pattern -m | 0110 | 20000 |

CF-2111  CF-2112

Subsection 2.1.2: State NOTIFICATION IND_RCVD

CF-2120

| DATA PATTERN | TOKEN | RF |
|---|---|---|
| Pattern -0 | 01010 | 1510 |
| Pattern -1 | 01100 | 1608 |
| Pattern -2 | 10100 | 1707 |
| ...... | ... | ... |
| Pattern -j | 0110000 | 112 |
| ...... | ... | ... |
| Pattern -n | 1010 | 20000 |

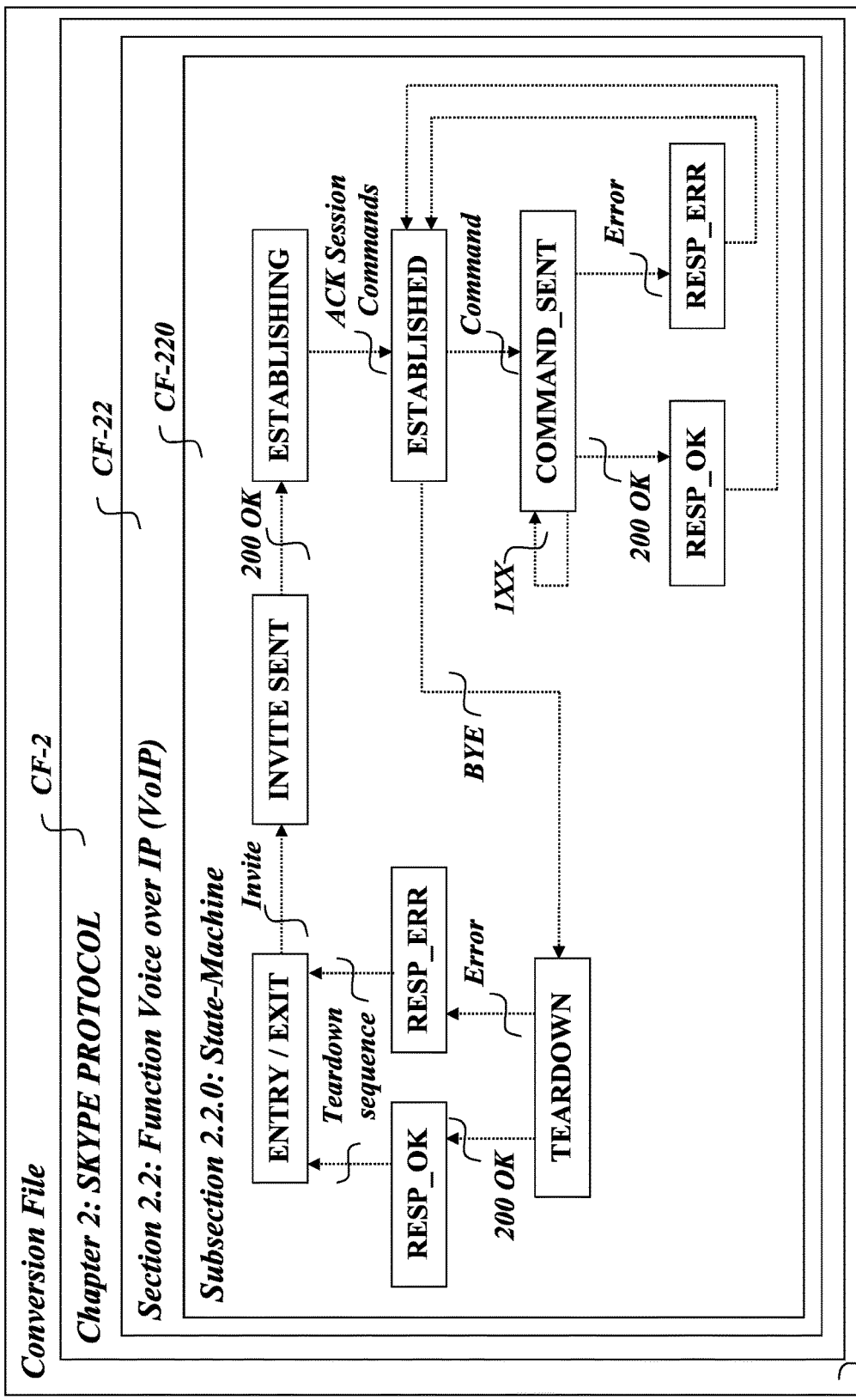
FIG. -6c-

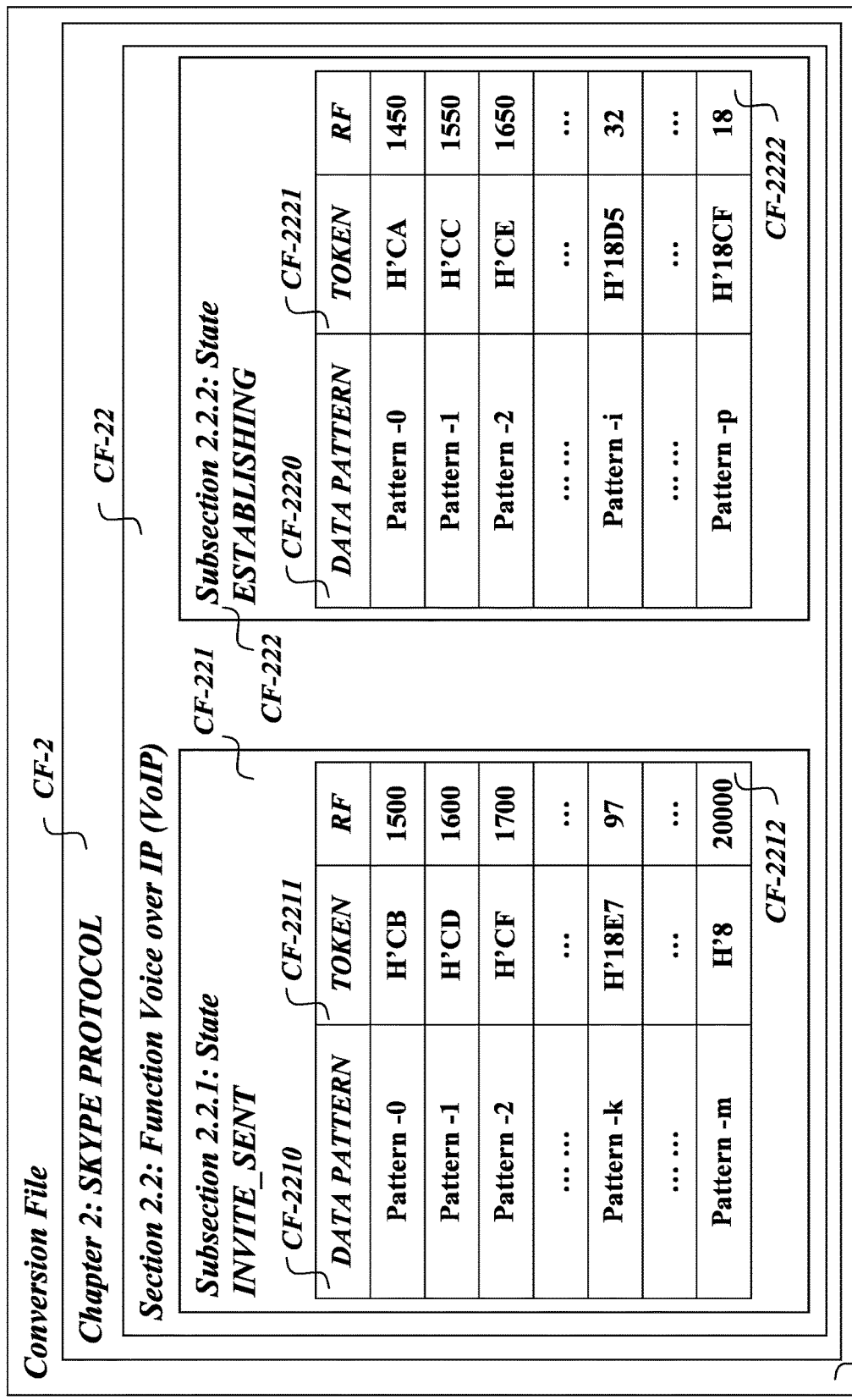
FIG. -6d-

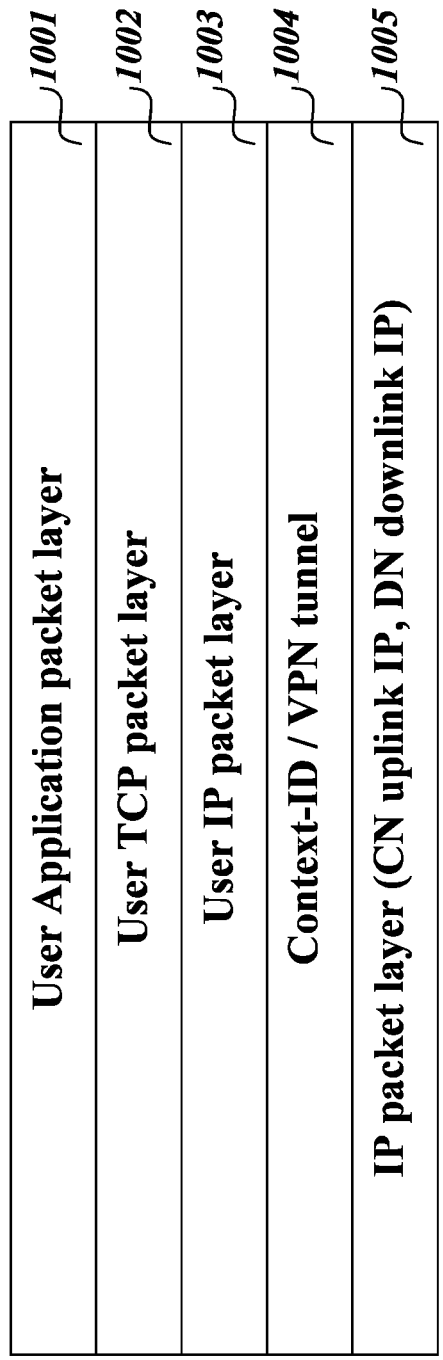
FIG. -7-

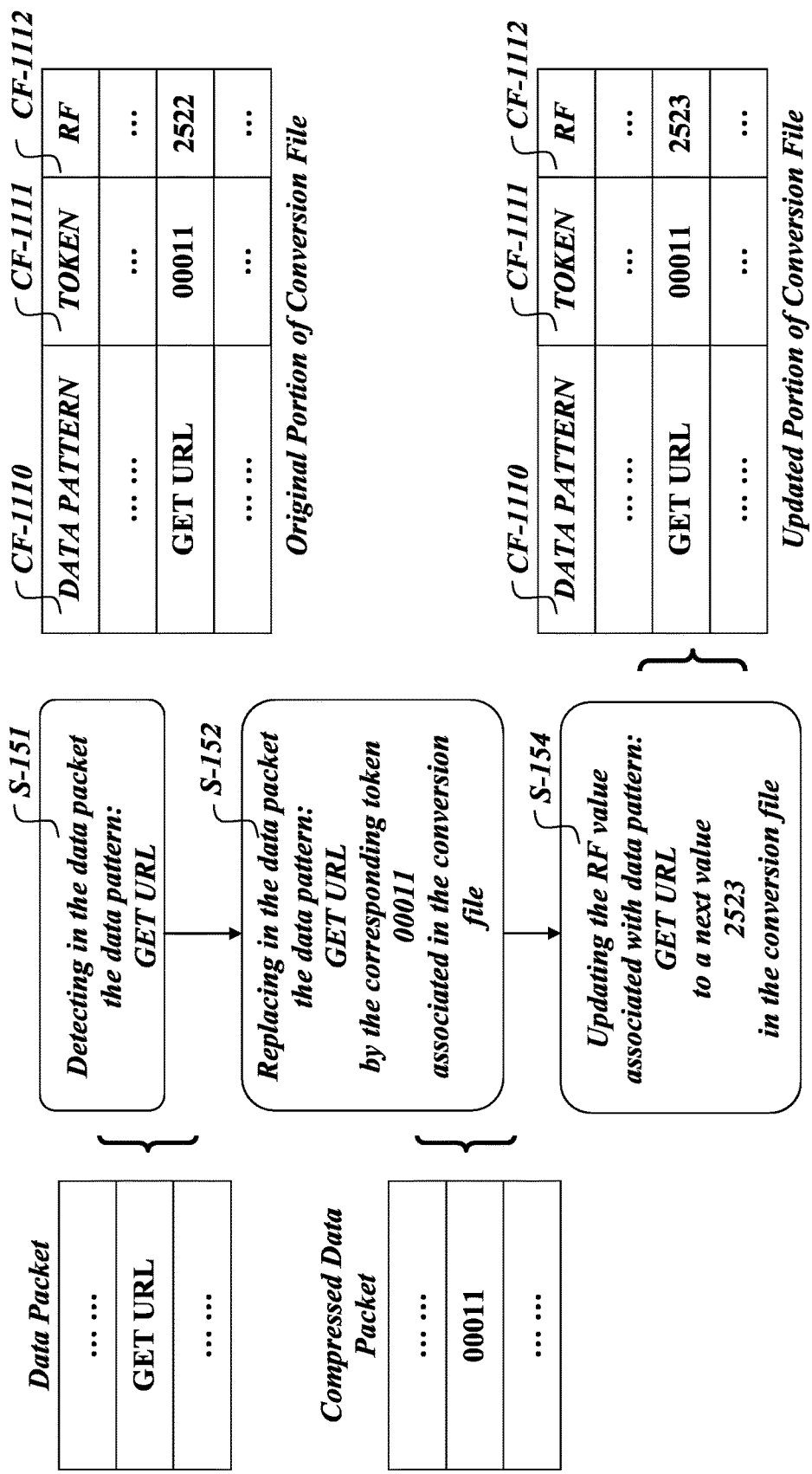
FIG. -8-

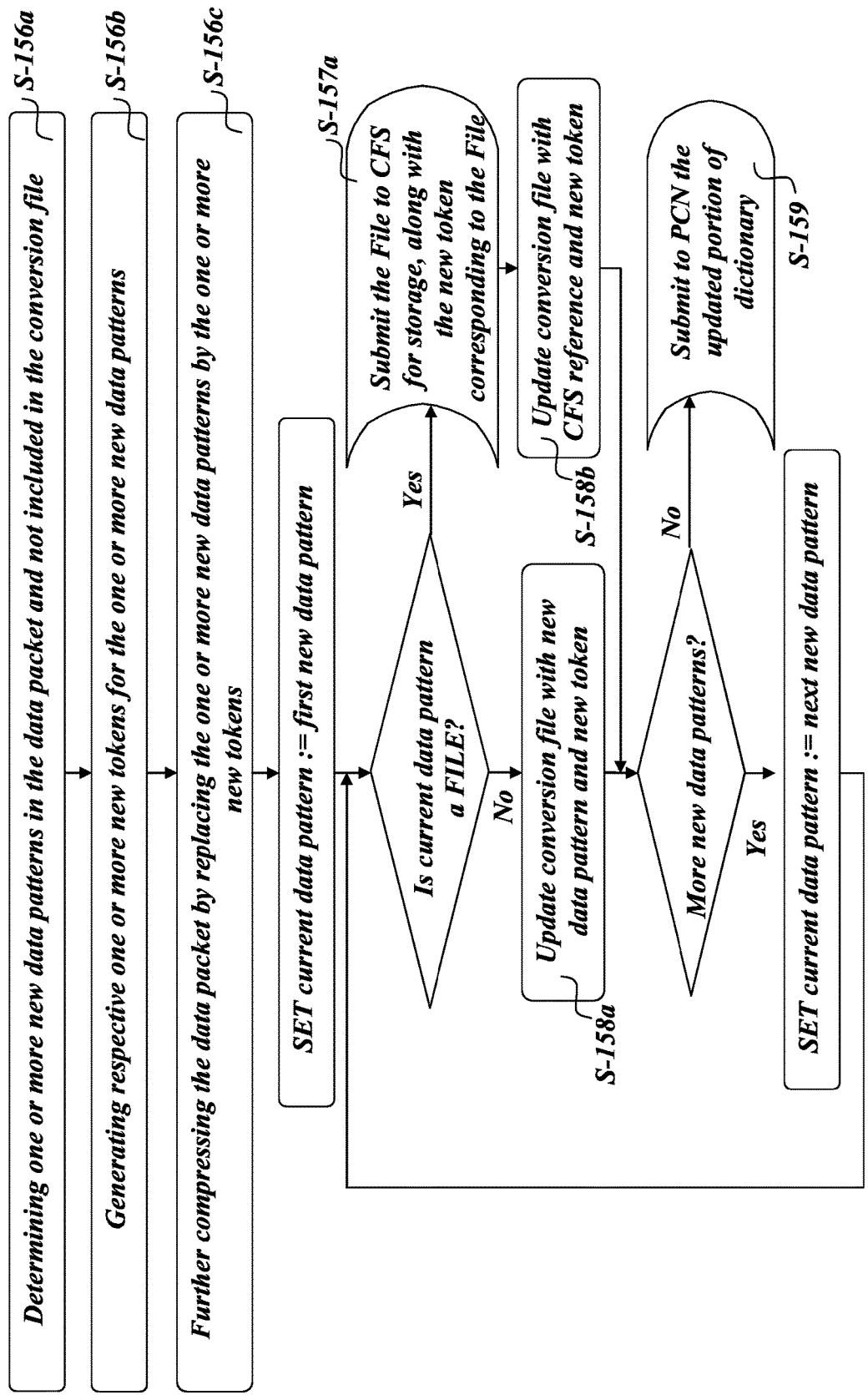
FIG. -9-

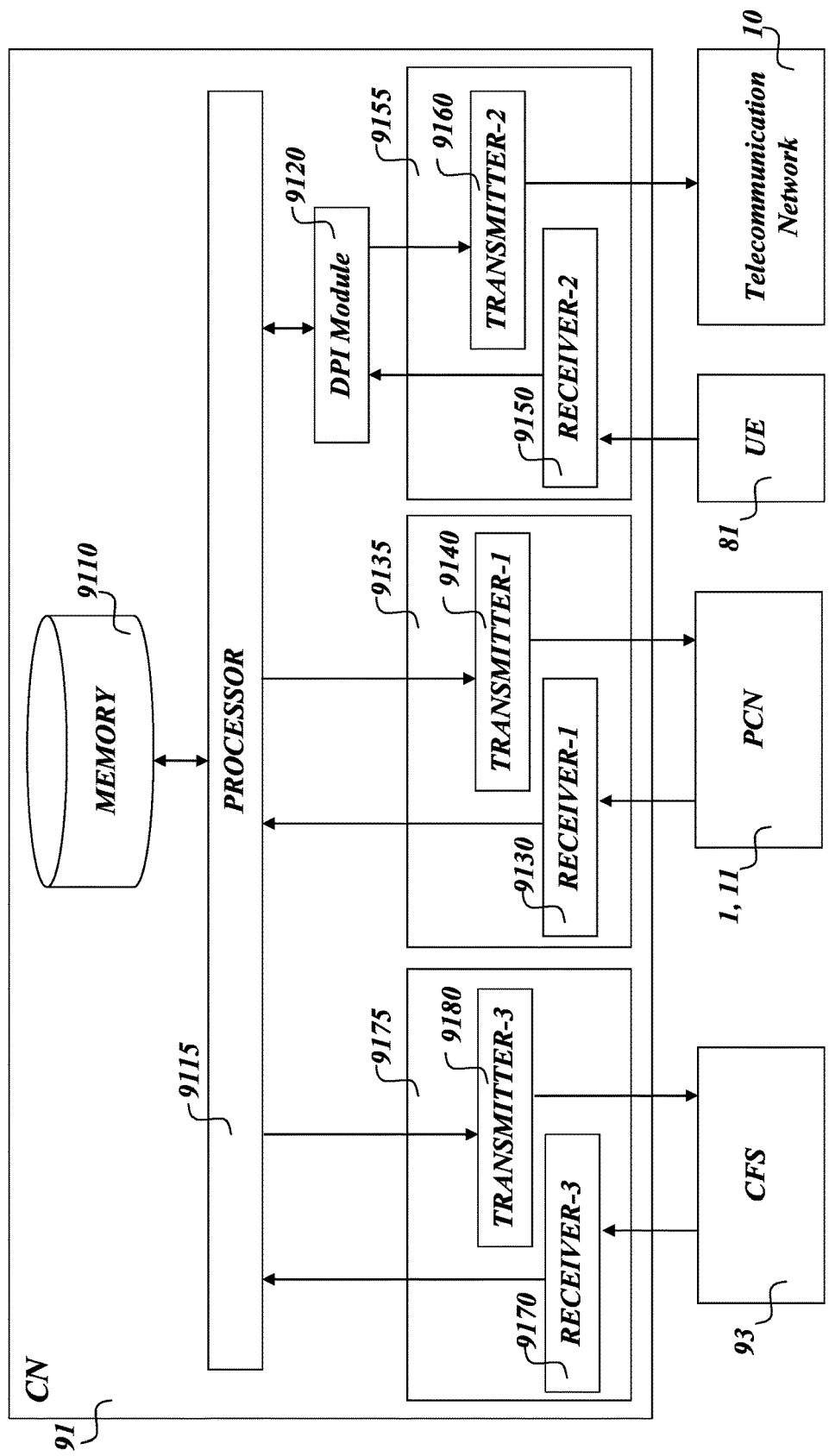
FIG. -10-

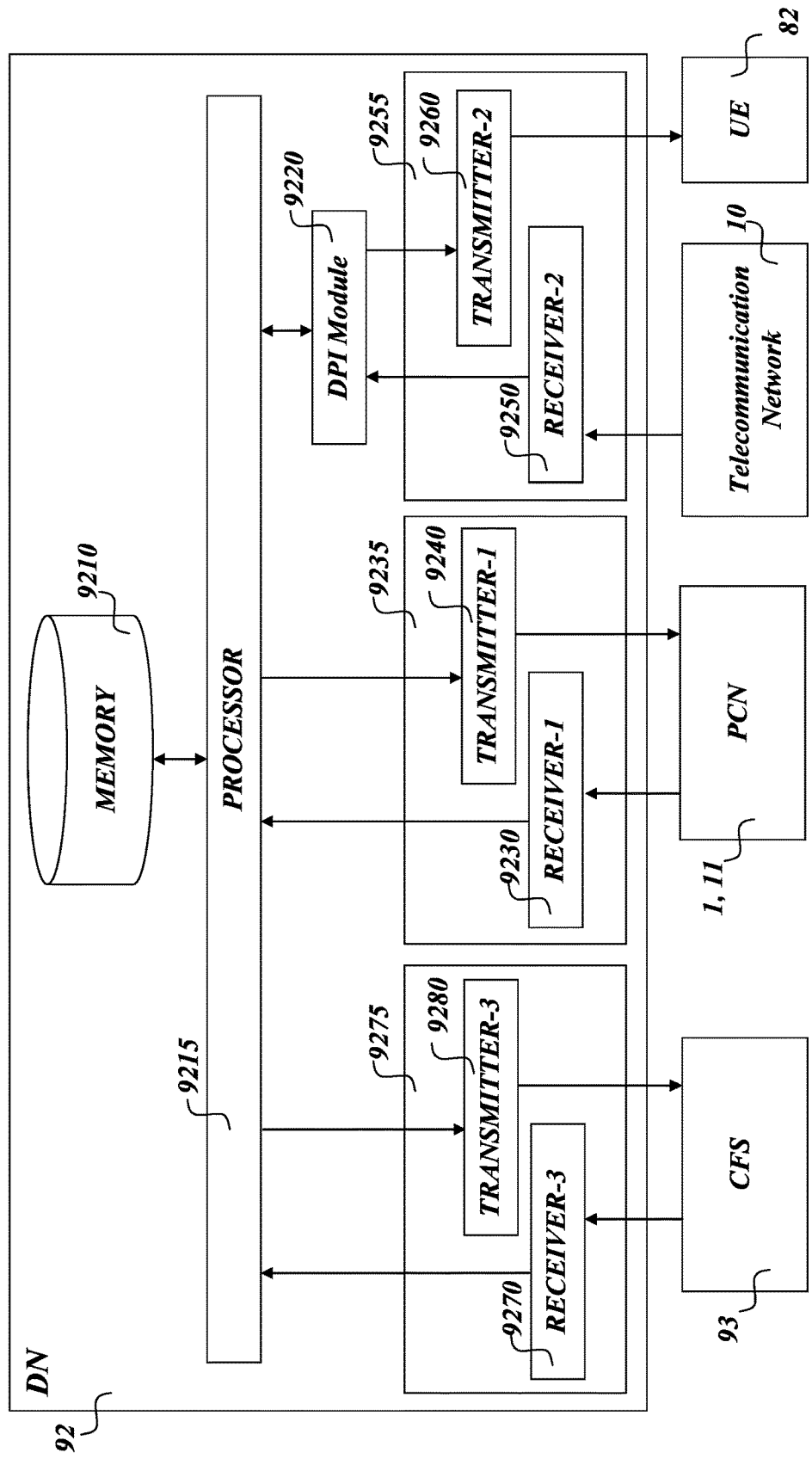
FIG. -11-

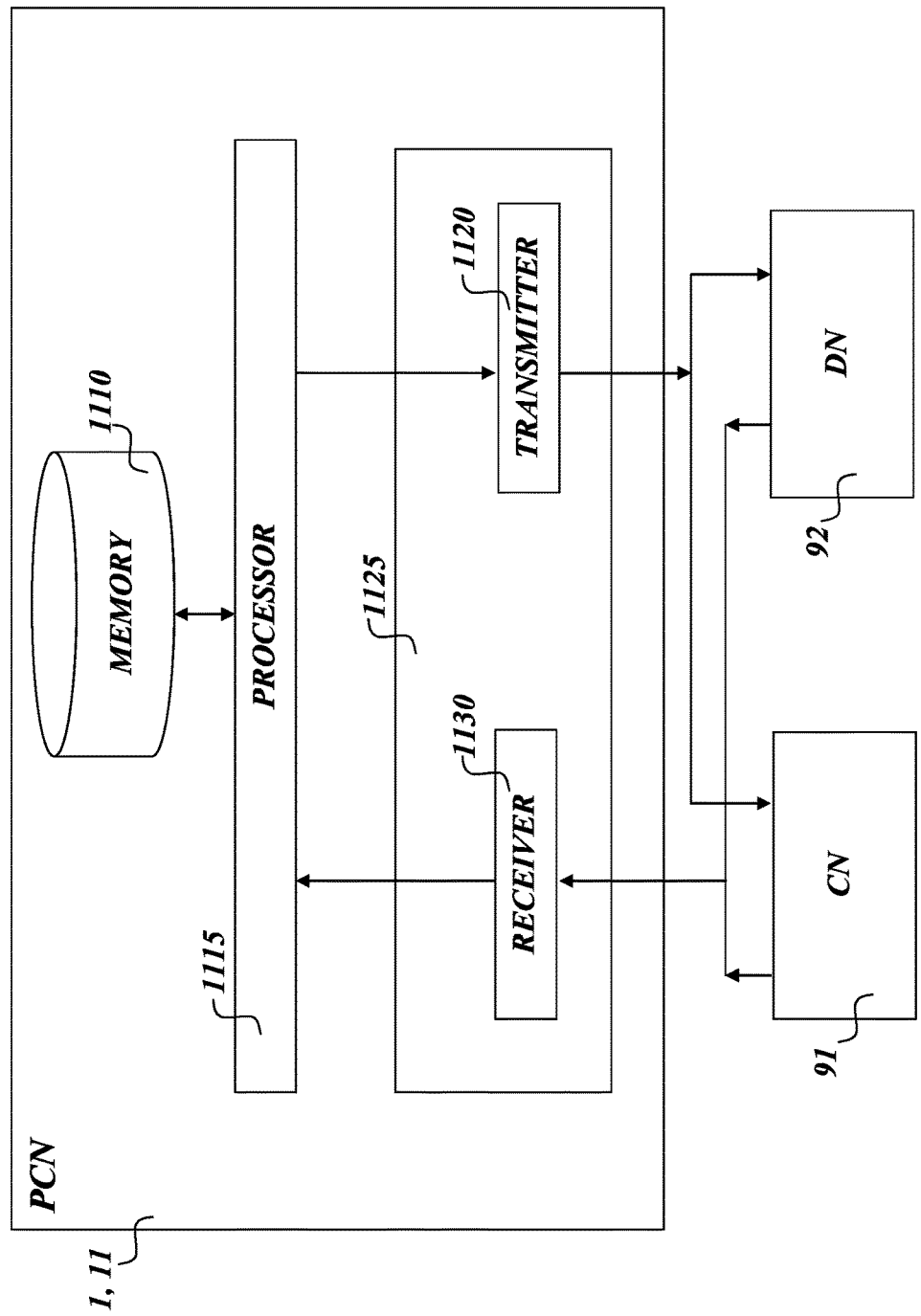
FIG. -12-

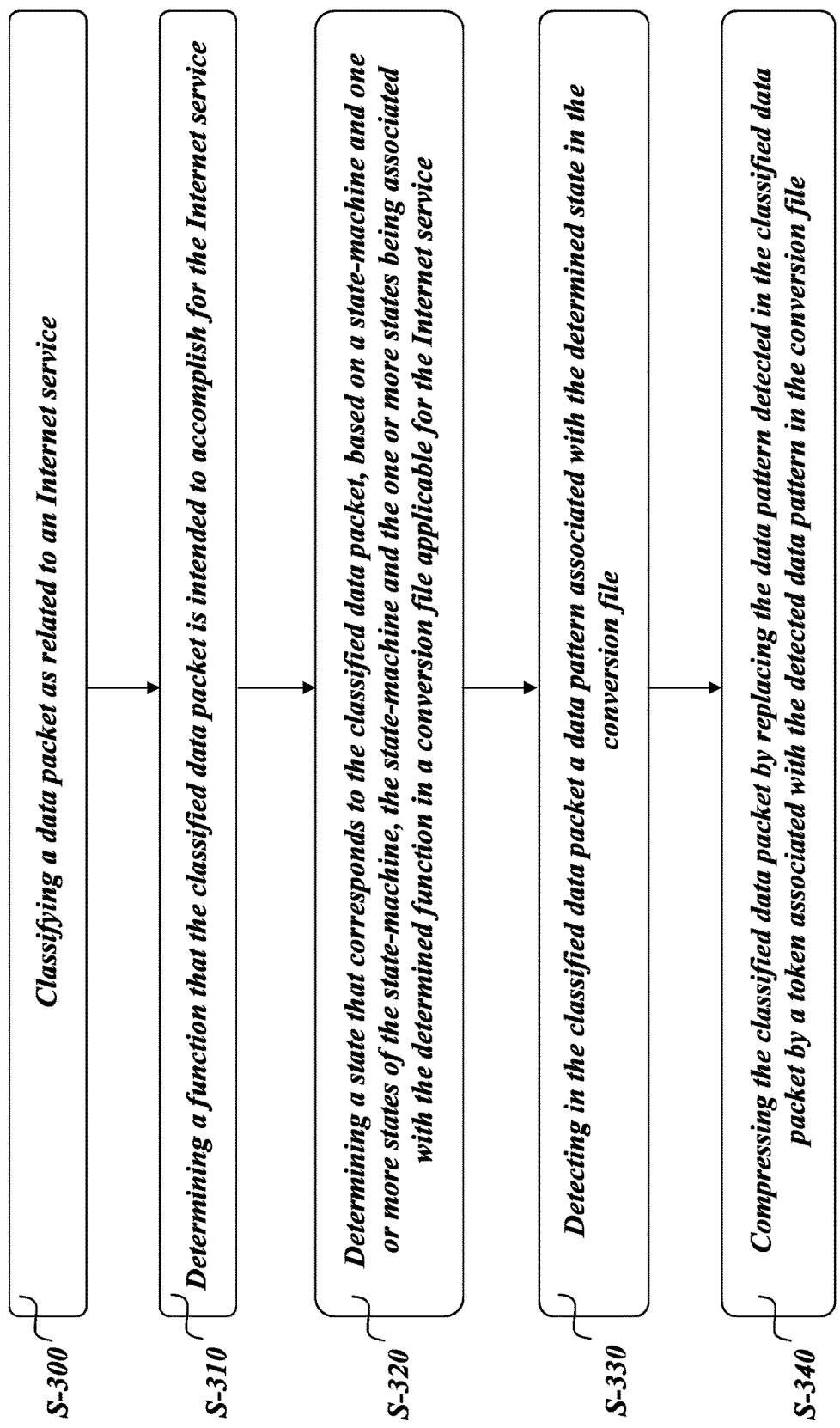
FIG. -13-

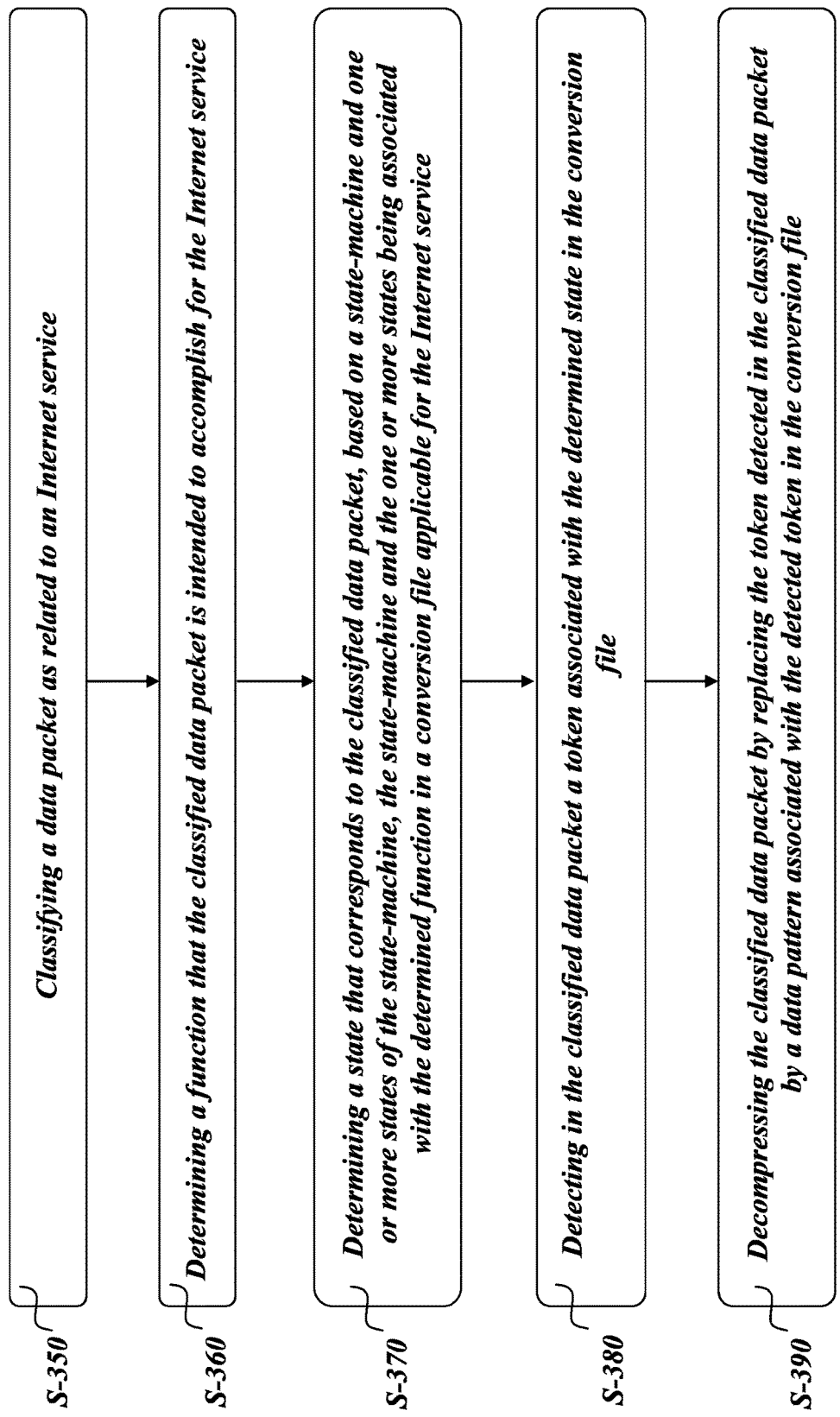
FIG. -14-

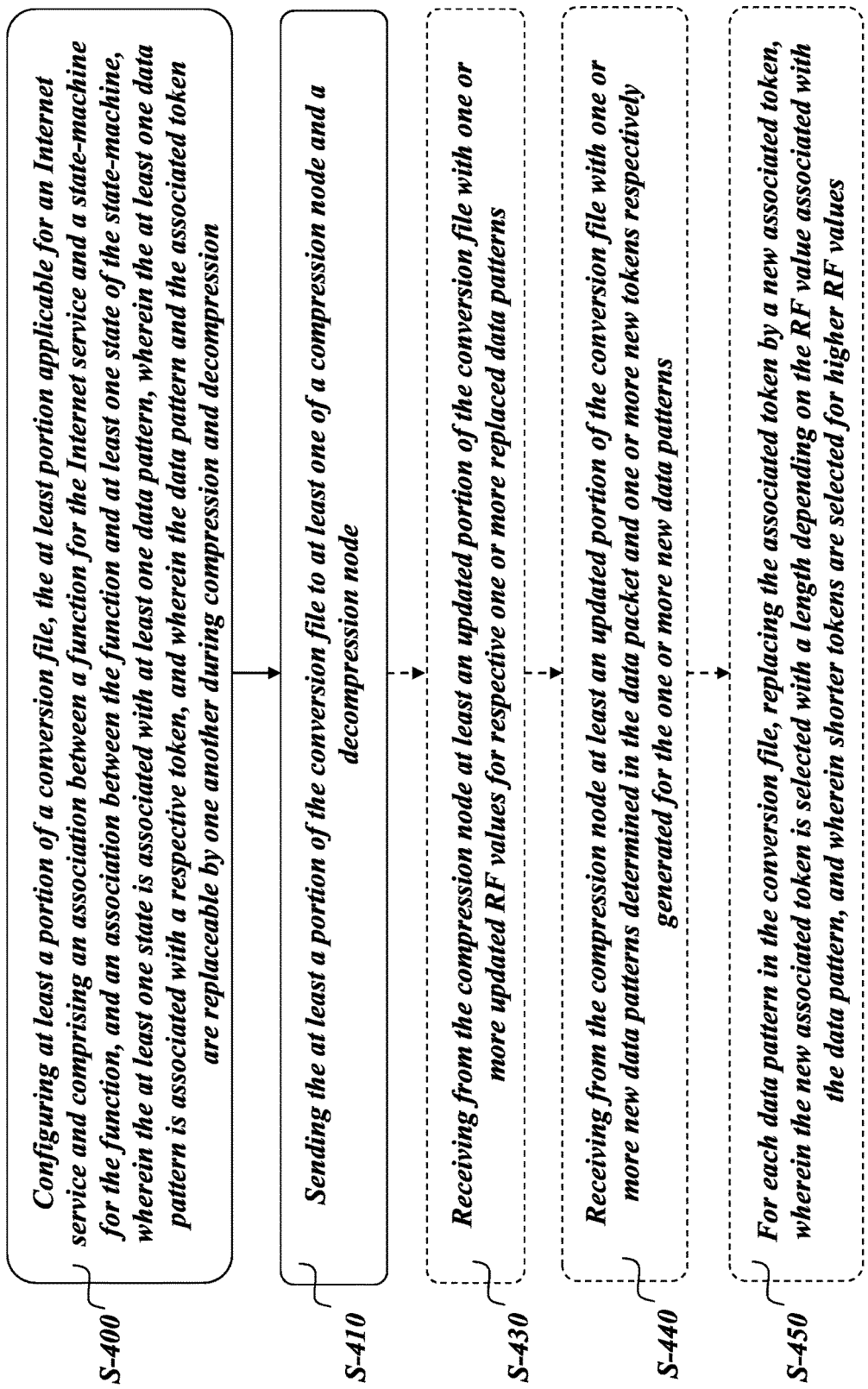

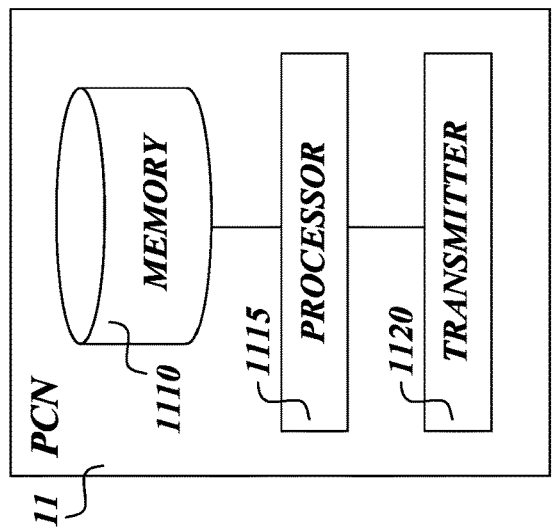
FIG.-18-
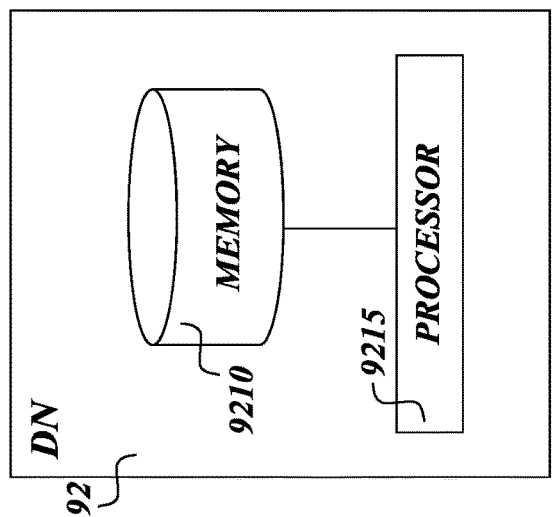
FIG.-17-
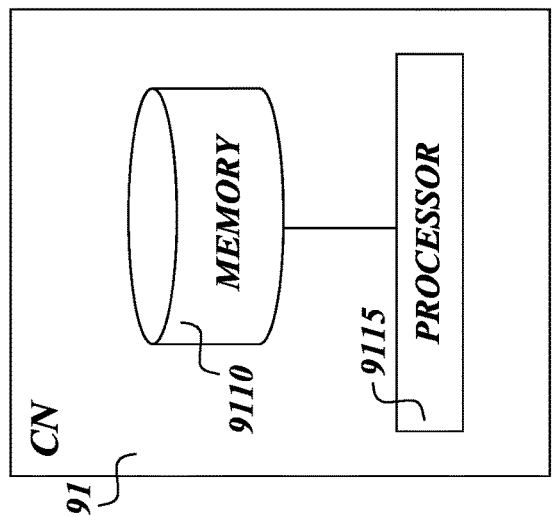
FIG.-16-

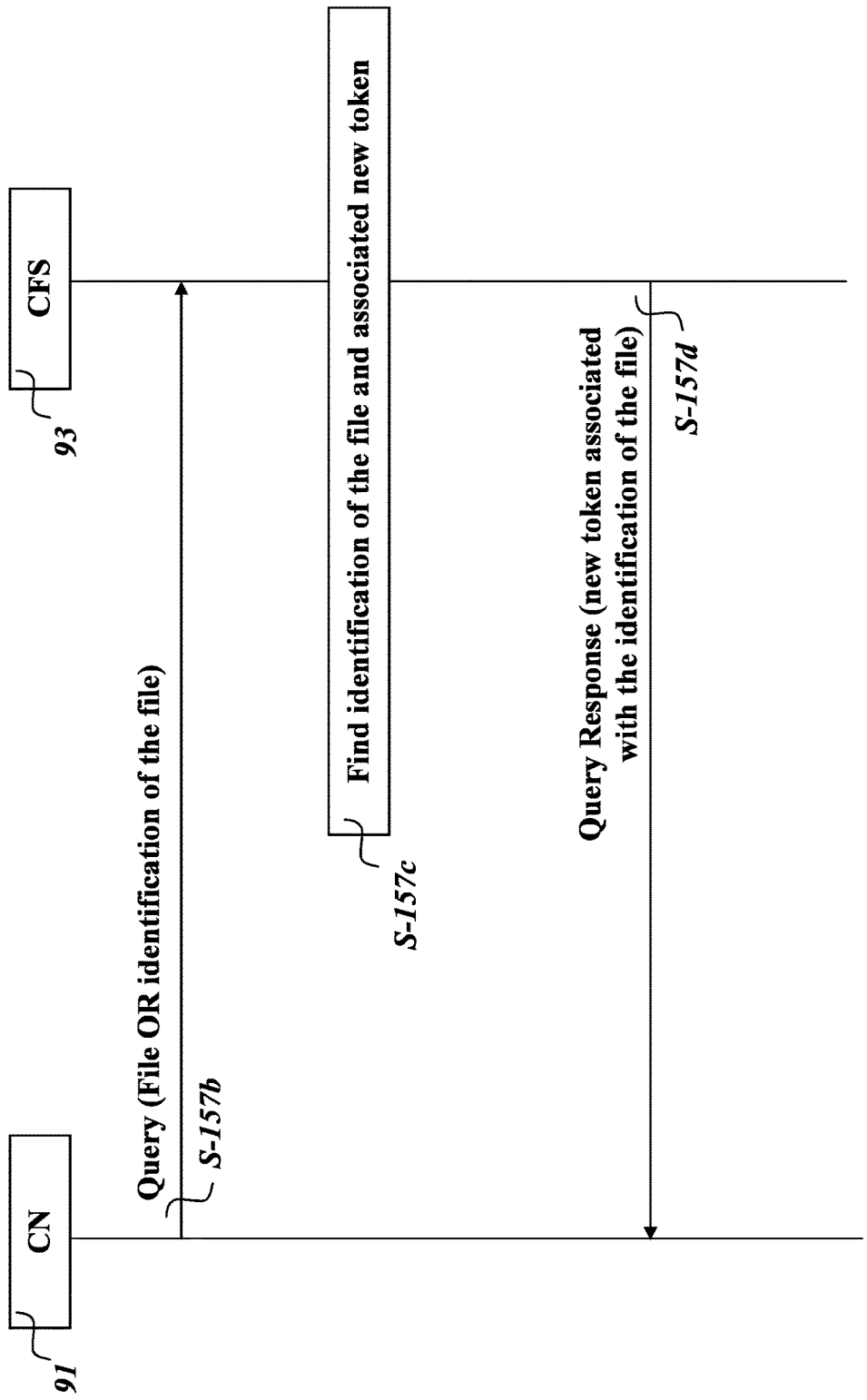
FIG. -19-

METHODS AND NETWORK NODES FOR COMPRESSION AND DECOMPRESSION OF DATA PACKETS

TECHNICAL FIELD

The present invention generally relates to data compression and, more specifically, the present invention relates to compression of data packets.

BACKGROUND

Data compression is a process of reducing the size of a data file, and is mainly used in static files. For instance, the lossless method Lempel-Ziv (LZ), as well as its variants 'pkzip' and 'gzip', are widely spread and known compression methods for compression of static data files.

In addition, there are standards for data compression, such as RFC 3173 and RFC 1444, and which are applicable for specific protocols, such as for TCP/IP headers. Specifically in the radio networks, WCDMA and LTE make it use of a Packet Data Convergence Protocol (PDCP) based on a Robust Header Compression (RoHC) to compress IP/TCP headers.

Generally speaking, the above techniques are not usually followed to compress data packets from higher application layers but only for TCP/IP headers; and, where an attempt is made to apply the above techniques for compression of data packets from higher application layers, i.e. OSI layer 7, the compression rate achieved is poor.

Currently, there are approaches to develop methods for compression and decompression and applicable for specific protocols. For instance, Anat Bremler-Barr (Interdisciplinary Center Herzliya), Shimrit Tzur David (Interdisciplinary Center Herzliya & The Hebrew University of Jerusalem), David Hay (The Hebrew University of Jerusalem) and Yaron Koral (Tel Aviv University) have developed a method disclosed in http://www.eng.tau.ac.il/~boaz/inetsem/tzur.pptx, hereinafter Tzur method, for compression and decompression over HTTP protocol by using Deep Packet Inspection (DPI) for shared dictionary. The Tzur method applies an Aho-Corasick (AC) algorithm on a dictionary represented by a finite state machine with a number of states ($S_0, \ldots S_{14}$), wherein the occurrence of an individual character (B) represents a transition from one state ($S_0$) to another ($S_2$) and it is represented as a function $[g(S_0, B) \rightarrow S_2]$, wherein a sequence of characters (C, D, B, C) to be replaced in the text, namely a pattern, is associated with a corresponding sequence of states ($S_7, S_8, S_9, S_{10}$), wherein the states are sequentially ordered (5, 6, 7, 8), and wherein the pattern (C, D, B, C) can be replaced by a pair comprising a pointer (5), namely the ordinal number of the first state in pattern, and a distance (4) to jump in order to reach a first next character not included in the pattern to replace. For example, if the uncompressed data were ABDBCDBCAAB, with the assumptions above, the compressed data would be ABDB(5, 4)AAB.

Whilst it is recognized that the Tzur method can operate with patterns of different lengths and can benefit the replacement of larger patterns by the pair pointer and distance, the required association of individual characters with individual states, and the association of a particular character with as many states as appearances of the particular character in different patterns, may require a very large and complex state machine as well as complex rules or restrictions to handle shared prefixes between different patterns.

Apart from that, this sort of mechanisms, where individual characters or even group of characters are directly associated with one or more states and represent transitions between states, become quite complex when used for compression of binary files, especially, on the handling of prefixes between different patterns.

Regarding compression and decompression of data packets, wherein a sequence of data packets might involve data packets based on different protocols, the Tzur method might be quite unfeasible in terms of difficulties to configure a dictionary with patterns for different protocols, huge amount of states in the state machine especially due to the individual association of one character with one transition between two states, and the handling of prefixes between different patterns.

Regarding DPI, current implementations of entities of a Policy and Charging Control (PCC) architecture, as specified in 3GPP TS 23.203 v12.2.0 (2013 Sep. 12), already incorporate DPI techniques. For instance, a Policy Control Enforcement Function (PCEF) of the PCC architecture encompasses service data flow detection, policy enforcement and flow based charging functionalities. A DPI technology, when embedded in the PCEF, supports packet inspection and service classification, which consists on IP packets classified according to a configured tree of rules so that they are assigned to a particular service session. In addition, some current embodiments of a Traffic Detection Function (TDF), which is an entity of the PCC architecture in charge of performing application's traffic detection and reporting of the detected application, and even an Application Function (AF) of the PCC architecture, may also incorporate DPI techniques for traffic inspection.

A central point of the PCC architecture, interfacing with the PCEF, the TDF and the AF, is the Policy and Charging Rules Function (PCRF). The PCRF is a functional element that performs policy control decisions and flow based charging control. The PCRF provides network control regarding the service data flow detection, gating, quality of service (QoS) and flow based charging—except credit management—towards the PCEF.

At present, the PCC architecture as specified in 3GPP TS 23.203 v12.2.0 (2013 Sep. 12) does not provide for compression and decompression of data packets.

There is thus a need to develop an alternative mechanism for compression and decompression of data packets which could offer a harmonized structure and operation irrespective of the protocol involved in the data packets and which may optimize the compression for those patterns more frequently appearing.

SUMMARY

The present invention is aimed to at least minimize the above drawbacks and provides for new methods and apparatuses for compression and decompression of data packets, which may significantly reduce the data packet payload and thus the transmission load trough a telecommunication network.

In accordance with a first aspect of the present invention, there is provided a method for compressing data packets in a compression node, hereinafter CN, of a telecommunication network.

This method comprises classifying a data packet as related to an Internet service; determining a function that the classified data packet is intended to accomplish for the Internet service; and determining a state that corresponds to the classified data packet, based on a state-machine and one or more states of the state-machine. The state-machine and the one or more states are associated with the determined function in a conversion file applicable for the Internet service. The method also comprises detecting in the classified data packet a data pattern associated with the determined state in the conversion file; and compressing the classified data packet by replacing the data pattern detected in the classified data packet by a token associated with the detected data pattern in the conversion file.

In an embodiment, the CN may comprise at least a portion of the conversion file. To this end, the method for compressing data packets in the CN may comprise obtaining the at least portion of the conversion file. The at least portion of the conversion file is applicable for the Internet service and comprises an association between at least one function for the Internet service and a respective state-machine for the at least one function, and an association between the least one function and at least one state of the state-machine, wherein the at least one state is associated with at least one data pattern detectable during compression, and wherein the at least one data pattern is associated with a respective token to replace the data pattern during compression.

In an embodiment applicable where the conversion file is static, in terms of maintaining a fixed number of data patterns and associated tokens, the method may further comprise receiving the at least portion of the conversion file from at least one of: an Operation and Maintenance System (OMS) of the telecommunication network, a Provisioning System of the telecommunication network, and a Service Provider server that provides a compression service.

In other embodiment applicable where the conversion file is dynamic, for example, in terms of allowing addition of new data patterns and associated new tokens on run-time, and/or in terms of reassigning shorter tokens to be associated with the most frequently replaced data patterns, the method may further comprise receiving the at least portion of the conversion file from a policy control node, hereinafter PCN, of the telecommunication network.

In a further embodiment of the invention, in which the at least portion of the conversion file is received from the PCN, the method may further comprise, upon replacing the detected data pattern by the associated token, sending to the PCN identification information related to the replaced data pattern. This identification information is to be used by the PCN to update a replacement frequency, hereinafter RF, value to a next value, wherein the RF value is associated with the replaced data pattern in the at least portion of the conversion file that the PCN maintains, and wherein the RF value indicates a frequency of previous replacements of the replaced data pattern during compression.

Alternatively or additionally to the sending of the identification information related to the replaced data pattern, the method may further comprise receiving an RF value associated with the detected data pattern in the at least portion of the conversion file, wherein the RF value indicates a frequency of previous replacements of the detected data pattern during compression. Upon replacing the detected data pattern by the associated token, the method may further comprise updating the RF value associated with the detected data pattern to a next value in the at least portion of the conversion file, and sending to the PCN the updated RF value and identification information related to the replaced data pattern.

These embodiments to handle RF values are useful to optimize the compression for those patterns more frequently appearing in the data packets.

Alternatively or additionally to the embodiments related to RF values and still applicable to the embodiment in which the at least portion of the conversion file is received from the PCN, the method may further comprise: determining in the data packet a new data pattern, which is not associated with the determined state in the at least portion of the conversion file; generating, for the new data pattern, a new token, which is not associated with the determined state in the at least portion of the conversion file; and further compressing the data packet by replacing the new data pattern by the new token. This embodiment of further compressing the data packet by determining new data patterns and generating new tokens is advantageous when a desired compression rate was not achieved by the compression made based on the contents of the at least portion of the conversion file.

Particularly applicable where a new data pattern corresponds to an identification of a file, the method may further comprise sending to a cache file server, hereinafter CFS, the identification of the file and the new token, and sending to the PCN a reference to the CFS, instead of the new data pattern, along with the new token and identification information related to the new data pattern. Besides, the method may also comprise a step of updating the at least portion of the conversion file by associating the reference to the CFS, instead of the new data pattern, and the new token with the determined state in the at least portion of the conversion file.

In an alternative embodiment also particularly applicable where a new data pattern corresponds to an identification of a file, the method may further comprise sending to a cache file server, hereinafter CFS, the identification of the file, receiving from the CFS a new token associated with the identification of the file at the CFS, and sending to the PCN a reference to the CFS, instead of the new data pattern, along with the new token and identification information related to the new data pattern. Besides, the method may also comprise a step of updating the at least portion of the conversion file by associating the reference to the CFS, instead of the new data pattern, and the new token with the determined state in the at least portion of the conversion file Particularly applicable where a new data pattern does not correspond to an identification of a file, the method may further comprise sending to the PCN the new data pattern, the new token and identification information related to the new data pattern. Besides, the method may also comprise a step of updating the at least portion of the conversion file by associating the new data pattern and the new token with the determined state in the at least portion of the conversion file.

Additionally to anyone of the above embodiments, and for the purpose of applying a selective compression to some Internet services, and not necessarily for all, the method may further comprise receiving from the PCN a control policy indicating at least one of an Internet service whose associated data packets are subject of compression, and a compression rate.

In accordance with a second aspect of the present invention, there is provided a method in a policy control node, hereinafter PCN, of a telecommunication network, for controlling at least one of compression and decompression of data packets.

This method comprises configuring at least a portion of a conversion file. The at least portion of the conversion file is applicable for an Internet service and comprises an association between at least one function for the Internet service and a respective state-machine, and an association between the least one function and at least one state of the state-machine for the function, wherein the at least one state is associated with at least one data pattern, wherein the at least one data pattern is associated with a respective token, and wherein the at least one data pattern and the associated token are replaceable by one another during compression and decompression.

This method also comprises sending the at least portion of the conversion file to at least one of a compression node and a decompression node.

In order to optimize the compression for those patterns more frequently appearing in data packets, this method may further comprise: receiving from the compression node identification information related to a replaced data pattern; identifying, based on the identification information, the replaced data pattern in the at least portion of the conversion file; and updating a replacement frequency, hereinafter RF, value to a next value, wherein the RF value is associated with the replaced data pattern in the at least portion of the conversion file that the PCN maintains, and wherein the RF value indicates a frequency of previous replacements of the replaced data pattern during compression.

Alternatively or additionally to receiving the identification information related to the replaced data pattern, this method may further comprise: sending to the compression node an RF value associated with the at least one data pattern and the respectively associated token in the at least portion of the conversion file, wherein the RF value indicates a frequency of previous replacements of the at least one data pattern during compression; receiving from the compression node an updated RF value and identification information related to a replaced data pattern; identifying, based on the identification information, the replaced data pattern in the at least portion of the conversion file; and updating the RF value associated with the replaced data pattern to a next value in the at least portion of the conversion file.

From time to time, at least, and desirably during low or null activity of the compression and decompression nodes, this method may further comprise, for each data pattern in the at least portion of the conversion file, replacing the associated token by a new associated token, wherein the new associated token is selected with a length depending on the RF value associated with the data pattern, and wherein shorter tokens are selected for higher RF values.

Alternatively or additionally to the embodiments related to RF values, this method may further comprise: receiving from the compression node a new data pattern, a new token and identification information related to the new data pattern; identifying, based on the identification information, a state associated with a function for the Internet service in the at least portion of the conversion file; and associating the new data pattern and the new token with the identified state in the at least portion of the conversion file.

Additionally to anyone of the above embodiments, and for the purpose of applying a selective compression to some Internet services and not for all, the method may further comprise sending a control policy to the at least one of the compression node and the decompression node, the control policy indicating anyone of: an Internet service which data packets are subject of compression or decompression, and a compression rate.

In accordance with a third aspect of the present invention, there is provided a method for decompressing data packets in a decompression node, hereinafter DN, of a telecommunication network.

This method comprises classifying a data packet as related to an Internet service; determining a function that the classified data packet is intended to accomplish for the Internet service; and determining a state that corresponds to the classified data packet, based on a state-machine and one or more states of the state-machine. The state-machine and the one or more states are associated with the determined function in a conversion file applicable for the Internet service. The method also comprises detecting in the classified data packet a token associated with the determined state in the conversion file; and decompressing the classified data packet by replacing the token detected in the classified data packet by a data pattern associated with the detected token in the conversion file.

In an embodiment, the DN may comprise at least a portion of the conversion file. To this end, the method for decompressing data packets in the DN may comprise obtaining the at least portion of the conversion file. The at least portion of the conversion file is applicable for the Internet service and comprises an association between at least one function for the Internet service and a respective state-machine for the at least one function, and an association between the least one function and at least one state of the state-machine, wherein the at least one state is associated with at least one token detectable during decompression, and wherein the at least one token is associated with a respective data pattern to replace the token during decompression.

As for the method for compressing data packets discussed above, in an embodiment applicable where the conversion file is static, in terms of maintaining a fixed number of data patterns and associated tokens, the method may further comprise receiving the at least portion of the conversion file from at least one of: an Operation and Maintenance System (OMS) of the telecommunication network, a Provisioning System of the telecommunication network, and a Service Provider server that provides a decompression service.

In other embodiment applicable where the conversion file is dynamic, for example, in terms of allowing addition of new data patterns and associated new tokens on run-time, and/or in terms of reassigning shorter tokens to be associated with the most frequently replaced data patterns, the method may further comprise receiving the at least portion of the conversion file from a policy control node, hereinafter PCN, of the telecommunication network.

In a further embodiment of the invention, wherein the at least portion of the conversion file is received from the PCN, and wherein the token detected in the data packet is associated with a reference to a cache file server, hereinafter CFS, in the at least portion of the conversion file, the method may further comprise sending the detected token to the CFS; and receiving from the CFS an identification of a file to be considered the data pattern associated with the token in the at least portion of the conversion file.

Additionally to anyone of the above embodiments, and for the purpose of applying a selective compression and decompression to some Internet services, and not necessarily for all, the method may further comprise receiving from the PCN a control policy indicating at least one of an Internet service whose associated data packets are subject of decompression, and a compression rate.

In accordance with a fourth aspect of the present invention, there is provided a compression node, hereinafter CN, for compressing data packets. This CN comprises corresponding technical features as the method for compressing data packets; and corresponding embodiments of the method for compressing data packets are also applicable for the CN.

In accordance with a fifth aspect of the present invention, there is provided a policy control node, hereinafter PCN, of a telecommunication network, for controlling at least one of compression and decompression of data packets. This PCN comprises corresponding technical features as the method for controlling at least one of compression and decompression of data packets; and corresponding embodiments of the method for controlling at least one of compression and decompression of data packets are also applicable for the PCN.

In accordance with a sixth aspect of the present invention, there is provided a decompression node, hereinafter DN, for decompressing data packets. This DN comprises corresponding technical features as the method for decompressing data packets; and corresponding embodiments of the method for decompressing data packets are also applicable for the DN.

In accordance with a seventh aspect of the present invention, there is provided a node of a telecommunications network comprising a policy and charging enforcement function of a policy and charging control architecture, and comprising at least one of: the compression node and the decompression node.

In accordance with an eighth aspect of the present invention, there is provided a node of a telecommunications network comprising a policy and charging rules function of a policy and charging control architecture, and comprising the policy control node.

In accordance with a ninth aspect of the present invention, there is provided a user equipment comprising at least one of: the compression node and the decompression node.

BRIEF DESCRIPTION OF THE DRAWINGS

The features, objects and advantages of the invention will become apparent by reading this description in conjunction with the accompanying drawings, in which:

FIG. 1 represents a basic PCC architecture comprising, amongst others, a TDF node, a PCEF node, an AF node and a PCRF node.

FIG. 2 shows an exemplary scenario in accordance with an embodiment of the invention, in which uplink and downlink traffic is exchanged between user equipment (UE) through a telecommunication network.

FIGS. 3a and 3b show an exemplary signaling diagram illustrating a sequence of actions carried out by a PCRF, a compression node acting as a first PCEF, and a decompression node acting as a second PCEF in accordance with a first embodiment of the invention.

FIGS. 4a and 4b show an exemplary signaling diagram illustrating a sequence of actions carried out by a policy control node, a compression node and a decompression node in accordance with a second embodiment of the invention.

FIGS. 5a and 5b illustrate an exemplary construction of a portion of the conversion file applicable for an HTTP protocol.

FIGS. 6a to 6d illustrate an exemplary construction of a portion of the conversion file applicable for a SKYPE protocol.

FIG. 7 basically shows the identification of a compression and decompression process with a context-ID.

FIG. 8 shows an exemplary flow chart and data modification illustrating a sequence of actions carried out by a compression node for replacing a data pattern by a token in accordance with an embodiment of the invention.

FIG. 9 shows an exemplary flow chart illustrating the steps carried out for identifying new patterns and for generating new corresponding tokens by the compression node in accordance with an embodiment of the invention.

FIG. 10 shows a block diagram of a compression node in accordance with an embodiment of the invention.

FIG. 11 shows a block diagram of a decompression node in accordance with an embodiment of the invention.

FIG. 12 shows a block diagram of a policy control node in accordance with an embodiment of the invention.

FIG. 13 is a basic flow chart illustrating a method for compressing data packets in a compression node in accordance with an embodiment of the invention.

FIG. 14 is a basic flow chart illustrating a method for decompressing data packets in a decompression node in accordance with an embodiment of the invention.

FIG. 15 is a basic flow chart illustrating a method in a policy control node for controlling at least one of compression and decompression of data packets in accordance with an embodiment of the invention.

FIG. 16 shows basic components of a compression node.

FIG. 17 shows basic components of a decompression node.

FIG. 18 shows basic components of a policy control node.

FIG. 19 shows an exemplary signaling diagram illustrating a sequence of actions carried out by a compression node to obtain a token associated with an identification of a file in accordance with an embodiment of the invention.

DETAILED DESCRIPTION

The following describes embodiments of a method for compressing data packets in a compression node, hereinafter CN; a method for decompressing data packets in a decompression node, hereinafter DN; a method for controlling at least one of compression and decompression of data packets, the method applying in a policy control node, hereinafter PCN; and corresponding embodiments for the CN, DN and PCN.

In particular, a CN may comprise, be included in, or act as, at least one of a PCEF node 2 and a TDF node 4, of a PCC architecture illustrated in FIG. 1, for compressing data packets. In particular, a DN may comprise, be included in, or act as, at least one of a PCEF node and a TDF node, of the PCC architecture illustrated in FIG. 1, for decompressing data packets. In particular, a PCN may comprise, be included in, or act as, a PCRF node 1, of the PCC architecture illustrated in FIG. 1, for controlling at least one of compression and decompression of data packets.

The FIG. 1 is a basic block diagram showing a PCC architecture with a TDF node 4, a PCEF node 2, an AF node 5 and a PCRF node 1, which are explained in the background section. The PCC architecture further comprises a Subscription Profile Repository (SPR) node 3, an Online Charging System (OCS) 7, and an Offline Charging System (OFCS) 6. In particular, the SPR 3 may provide subscriber policies to the PCRF node. Also in particular, the fact of compressing data packets for a user and transmitting the compressed data packets through the telecommunications network may decrease the charging applied to compressed data packets. Given that the OCS 7 and OFCS 6 are involved in charging features for users, and given that both OCS and OFCS have direct interfaces to the PCEF, both CN and DN comprising, being included in, or acting as, a PCEF node may be advantageous for the purpose of decreasing charging.

FIG. 2 illustrates an exemplary scenario wherein a first PCEF node 21 and a second PCEF node 22 of a telecommunications network 10 both include a CN 91 and a DN 92, and wherein respective CN and DN are placed close to the edges of the telecommunication network so that compressed traffic packets are transmitted through the telecommunication network and decompressed traffic packets are transmitted outside. For the purpose of the scenario illustrated in FIG. 2, uplink traffic is to be understood as the traffic submitted towards the telecommunications network, and downlink traffic is to be understood as the traffic submitted from the telecommunications network. In this scenario, the uplink traffic submitted from a first user equipment (UE) 81 is received in the CN 91 of the first PCEF node 21; the CN 91 compresses the uplink traffic data packets and submits the compressed data packets C12 towards a destination edge. In this case, the destination edge may be a second PCEF node 22 in communication with a second UE 82. The DN 92 of the second PCEF node 22 decompresses the compressed data packets C12 and submits the decompressed data packets as downlink traffic to the second UE 82. Likewise, the uplink traffic submitted from the second UE 82 is received in the CN 91 of the second PCEF node 22; the CN 91 compresses the uplink traffic data packets and submits the compressed data packets C21 towards a destination edge. In this case, the destination edge may the first PCEF node 21 in communication with the first UE 81. The DN 92 of the first PCEF node 21 receives the compressed data packets C21, decompresses the compressed data packets and submits the decompressed data packets as downlink traffic to the first UE 81. In this scenario for an embodiment of the invention, where the first PCEF node 21 acts as the CN 91 and the second PCEF node 22 acts as the DN 92, a PCRF node 1 may act as the PCN 11 provided for by the present specification.

In a further embodiment, anyone of CN and DN, individually or in combination, may be included in a Gateway GPRS Support Node (GGSN), and a Packet Data Network Gateway (PDN-GW).

In a still further embodiment, anyone of CN and DN, individually or in combination, may be included in a user terminal or user equipment, hereinafter both referred to as UE, such as a personal computer, laptop, smart phone, tablet and the like. For example, the UE may include a CN 91 and a DN 92. The CN 91 of the UE compresses data packets so that the UE submits compressed uplink traffic. The compressed uplink traffic is received, for example, at the first PCEF node 21, decompressed by DN 92 of the first PCEF node, processed in the first PCEF node 21 for enforcement of applicable PCC rules, compressed by the CN 91 and submitted as compressed data packets C12 towards the network. Likewise, compressed data packets C21 may be received at the first PCEF node 21 from the network, decompressed by the DN 92, processed by the first PCEF node 21, compressed again by the CN 91 and submitted as compressed downlink traffic to the UE 81. The DN 92 of the UE 81 decompresses the compressed downlink traffic and the UE 81 handles the decompressed downlink traffic.

Before explaining in detail these methods, the CN, the DN and the PCN, a conversion file for guiding, aligning and harmonizing the compression and decompression mechanisms is explained in accordance with embodiments of the invention.

The conversion file may be regarded as including one or more chapters, wherein each chapter applies to a specific Internet service, and wherein an Internet service is identified by a protocol identifier of the protocol implementing the Internet service. An exemplary conversion file CF is illustrated in FIG. 5a-5b, and FIG. 6a-6d, wherein FIG. 5a-5b illustrate an exemplary first chapter CF-1 dedicated to HTTP protocol, and FIG. 6a-6d illustrate an exemplary second chapter CF-2 dedicated to SKYPE protocol.

Any particular chapter, which applies to a specific Internet service, may be regarded as including one or more sections, wherein each section applies to a specific function of the Internet service. FIG. 5a-5b illustrate an exemplary first section CF-11 dedicated to the function HTTP Browsing of the HTTP protocol. A further section may be dedicated, for example, to the function HTTP Access Authentication of the HTTP protocol. FIG. 6a-6b illustrate an exemplary first section CF-21 dedicated to the function Instant-Messaging of the SKYPE protocol, and FIG. 6c-6d illustrate an exemplary second section CF-22 dedicated to the function Voice over IP of the SKYPE protocol.

Any particular section, applying to a specific function of an Internet service, may be regarded as including two or more subsections, wherein a subsection applies to a specific state-machine applicable for the function and wherein further one or more subsections apply to respective one or more states of the state machine. For instance, the exemplary section CF-11, dedicated to the function HTTP Browsing of the HTTP protocol, may include a first exemplary subsection CF-110 dedicated to the state-machine for the function, as illustrated in FIG. 5a, and a second exemplary subsection CF-111 and a third exemplary subsection CF-112 dedicated to the states SENT_REQ and RCVNG_RESP, respectively, as illustrated in FIG. 5b.

Also for instance, the exemplary section CF-21, dedicated to the function Instant-Messaging of the SKYPE protocol, may include a first exemplary subsection CF-210 dedicated to the state-machine for the function, as illustrated in FIG. 6a, and a second exemplary subsection CF-211 and a third exemplary subsection CF-212 dedicated to the states SEND REQ_SENT and NOTIFICATION IND_RCVD, respectively, as illustrated in FIG. 6b. Likewise, the exemplary section CF-22, dedicated to the function Voice over IP of the SKYPE protocol, may include a first exemplary subsection CF-220 dedicated to the state-machine for the function, as illustrated in FIG. 6c, and a second exemplary subsection CF-221 and a third exemplary subsection CF-222 dedicated to the states INVITE_SENT and ESTABLISHING, respectively, as illustrated in FIG. 6d.

In one embodiment, there is provided a subsection for each state of the state-machine. In other embodiments, there is provided a subsection for only some states of the state-machine. Even though it may be desirable that all states appearing in a state-machine like CF-110 get a dedicated subsection like CF-111, nothing in this specification precludes having fewer states with a dedicated subsection than those appearing in the state-machine. For those states not getting a dedicated subsection, compression or decompression would not be carried out.

Still with reference to the conversion file CF illustrated in FIG. 5a-5b and FIG. 6a-6d, any particular subsection applying to a specific state of the state-machine, for a function of an Internet service, may include one or more data patterns associated with respective one or more tokens, wherein the data pattern and associated token are replaceable by each other during compression and decompression. This replacement is part of the compression and decompression and will be further described later in detail in connection to corresponding methods and possible token codifications.

For instance, as illustrated in FIG. 5b, the subsection CF-111 for the state SENT_REQ includes one or more data patterns CF-1110 associated with respective one or more tokens CF-1111, and the subsection CF-112 for the state RCVNG_RESP includes one or more data patterns CF-1120 associated with respective one or more tokens CF-1121. As illustrated in FIG. 6b, the subsection CF-211 for the state SEND REQ_SENT includes one or more data patterns CF-2110 associated with respective one or more tokens CF-2111, and the subsection CF-212 for the state NOTIFI- CATION IND_RCVD includes one or more data patterns CF-2120 associated with respective one or more tokens CF-2121. As illustrated in FIG. 6*d*, the subsection CF-221 for the state INVITE_SENT includes one or more data patterns CF-2210 associated with respective one or more tokens CF-2211, and the subsection CF-222 for the state ESTABLISHING includes one or more data patterns CF-2220 associated with respective one or more tokens CF-2221.

These exemplary functions, state-machines and states of the state-machines explained above with reference to FIG. 5*a*-5*b* and FIG. 6*a*-6*d* are merely disclosed for explanatory purposes. Other functions, state-machines and states of the state-machines, recognizable in SKYPE or HTTP protocols, may be considered as well.

In an embodiment, each data pattern may also be associated with a replacement frequency (hereinafter RF) value representing previous detections and replacements of the said data pattern. For instance, the data patterns CF-1110 and CF-1120 illustrated in FIG. 5*b* may be respectively associated with RF values CF-1112 and CF-1122, the data patterns CF-2110 and CF-2120 illustrated in FIG. 6*b* may be respectively associated with RF values CF-2112 and CF-2122, and the data patterns CF-2210 and CF-2220 illustrated in FIG. 6*d* may be respectively associated with RF values CF-2212 and CF-2222.

As explained above, the compression is achieved by replacing one or more data patterns by corresponding one or more tokens, wherein the token is shorter in length than the data pattern. In some embodiments relating to token codification, tokens may comprise or may be configured as binary codes. In other embodiments relating to token codification, other codifications for the tokens are conceivable, such as alphanumeric strings.

The length of binary codes to be used as tokens can be selected in accordance with a maximum number of tokens and the bits necessary to codify the maximum number. The maximum number of required tokens may be established per state basis in the same manner as the data pattern is to be detected in the data packet.

Apart from that, not all the tokens associated with data patterns for a particular state must be given binary codes of the same length if an appropriate separator is used to identify the end of a token. To this end, a particular sequence of bits, not appearing in any valid token, may be used for separator or end of token. Alternatively, a type of token may be associated to each particular token to indicate the type of codification. For example type H'1 may indicate Hamming (2 out of 4), type H'2 may indicate Hamming (2 out of 5), type H'3 may indicate Hamming (2 out of 7), type H'4 may indicate 4-bit binary code, type H'5 may indicate 8-bit binary code, etc.

The present specification provides for using binary codes of shorter length for tokens associated with data patterns more frequently appearing in a data packet, and binary codes of longer length for tokens associated with data patterns infrequently appearing in a data packet. To this end, the RF values discussed above may be used in assigning particular token values to associated data patterns. That is, shorter tokens may be assigned for higher RF values, medium tokens may be assigned for medium RF values, and longer tokens may be assigned for lower RF values.

For instance, as illustrated in FIG. 6*b*, tokens CF-2111 and CF-2121 with medium RF values are sequentially assigned a 5-bit code, tokens CF-2111 and CF-2121 with lower RF values are sequentially assigned a 7-bit code, and tokens CF-2111 and CF-2121 with higher RF values are sequentially assigned a 4-bit code. In particular, these 4-bit code, 5-bit code and 7-bit code may exemplary correspond to respective Hamming codes 2 out of 4, 2 out of 5 and 2 out of 7, which is a useful codification to detect transmission errors. Different coding systems may be used to optimize a free-error transmission and compression rates.

Also for instance, FIG. 6*d* illustrates a distribution of 4-bit, 8-bit and 16-bit tokens, wherein tokens CF-2211 and CF-2221 with medium RF values are exemplary assigned a 8-bit binary code, tokens CF-2211 and CF-2221 with lower RF values are exemplary assigned a 16-bit binary code, and tokens CF-2211 and CF-2221 with higher RF values are exemplary assigned a 4-bit binary code.

The usage of shorter tokens associated with data patterns more frequently appearing in a data packet, clearly optimizes the compression of data packets. Alternatively, the tokens may be configured with a same and fixed length.

Once the associations of functions with corresponding state-machines and states of the state-machines, per Internet service basis, and the associations of data patterns per state with corresponding tokens and RF values have been clarified with reference to the exemplary conversion file illustrated in FIG. 5*a*-5*b* and FIG. 6*a*-6*d*, the methods for compressing and decompressing data packets, the method for controlling the compression and decompression, the CN, DN and PCN can be further discussed in detail.

FIG. 13 illustrates a method for compressing data packets in the CN 91, in accordance with an embodiment of the invention.

As illustrated in FIG. 13, and with due regard to FIG. 5*a*-5*b*, this method comprises a step S-300 of classifying a data packet as related to an Internet service, such as for example HTTP protocol CF-1; and a step S-310 of determining a function that the classified data packet is intended to accomplish for the Internet service, such as the function HTTP Browsing CF-11 of the Internet service HTTP protocol.

Once the function HTTP Browsing CF-11 has been determined by inspecting contents in the classified data packet, the method comprises a step S-320 of determining a state that corresponds to the classified data packet, based on a state-machine CF-110 and one or more states CF-111 CF-112 of the state-machine, the state-machine CF-110 and the one or more states CF-111 CF-112 being associated with the determined function CF-11 in the conversion file CF for the HTTP protocol CF-1, as illustrated in FIG. 5*a*.

As already explained above with reference to FIG. 5*a*-5*b* and FIG. 6*a*-6*d*, the conversion file comprises an association for the Internet service between the determined function and one or more states of the state-machine. For illustrative purposes and by way of example, the CN 91 may determine in this step S-320 that the data packet corresponds to the state SENT-REQ, CF-111, illustrated in FIG. 5*b*.

In an embodiment, the method may further comprise an optional step of identifying by the CN, in a conversion file applicable for the Internet service, a state-machine and one or more states of the state-machine, the state-machine and the one or more states being associated with the determined function for the Internet service.

Once the state has been determined, and with reference to FIG. 13, the method comprises a step S-330 of detecting in the classified data packet a data pattern associated with the determined state in the conversion file for the Internet service.

To this end, the CN 91 may find a number of data patterns CF-1110 such as, for example, GET URL, USER-AGENT, ACCEPT, KEEP-ALIVE, etc., which are associated in the conversion file CF with the state SENT-REQ CF-111 as illustrated in FIG. 5b. Then, by inspecting contents in the classified data packet, the CN 91 may detect in the classified data packet at least one of these data patterns CF-1110.

Once the data pattern has been detected in the classified data packet, the method comprises a step S-340 of compressing the classified data packet by replacing the data pattern detected in the classified data packet by a token associated with the detected data pattern in the conversion file for the Internet service. That is, following with the exemplary case of detecting at least one of data patterns CF-1110, the CN 91 may replace the at least one data pattern by a respective token CF-1111 associated in the conversion file CF with the data pattern. For example, if the CN 91 had detected the data patterns ACCEPT and KEEP-ALIVE, the CN 91 would compress the data packet by replacing such data patterns by respective tokens 00101 and 0000011.

In this particular example, and in accordance with embodiments already explained above in respect of binary codes usable as tokens, the token associated with the data pattern ACCEPT is a (2 out of 5) Hamming code 00101, whereas the token associated with the data pattern KEEP-ALIVE is a (2 out of 7) Hamming code 0000011. Independently of having used a Hamming code or not, a 5-bit code has been selected as token for the data pattern with higher RF value, 1308, whereas a 7-bit code has been selected as token for the data pattern with lower RF value, 334.

By using shorter tokens, fewer bits, for data patterns more frequently used, the method can advantageously provide better compression rates throughout streams of data packets.

The method illustrated with reference to FIG. 13 can be carried out by the CN 91 illustrated in FIG. 16. This CN comprises at least one processor 9115, and a memory 9110 comprising instructions executable by the at least one processor, whereby the CN is configured to classify a data packet as related to an Internet service, to determine a function that the classified data packet is intended to accomplish for the Internet service, and to determine a state that corresponds to the classified data packet, based on a state-machine CF-110 and one or more states CF-111 of the state-machine. The state-machine CF-110 and the one or more states CF-111 are associated with the determined function CF-11 in a conversion file CF-1 applicable for the Internet service. The CN is also configured to detect in the classified data packet a data pattern CF-1110 associated with the determined state CF-111 in the conversion file CF-1 for the Internet service, and to compress the classified data packet by replacing the data pattern CF-1110 detected in the classified data packet by a token CF-1111 associated with the detected data pattern CF-1110 in the conversion file CF-1 for the Internet service.

FIG. 14 illustrates a method for decompressing data packets in the DN 92, in accordance with an embodiment of the invention.

As illustrated in FIG. 14, and with due regard to FIG. 5a-5b, this method comprises a step S-350 of classifying a data packet as related to an Internet service, such for example HTTP protocol CF-1; and a step S-360 of determining a function that the classified data packet is intended to accomplish for the Internet service, such as the function HTTP Browsing CF-11 of the Internet service HTTP protocol.

Once the function HTTP Browsing CF-11 has been determined by inspecting contents in the classified data packet, the method comprises a step S-370 of determining a state that corresponds to the classified data packet, based on a state-machine CF-110 and one or more states CF-111 CF-112 of the state-machine. The state-machine CF-110 and the one or more states CF-111 CF-112 are associated with the determined function CF-11 in the conversion file CF for the HTTP protocol CF-1, as illustrated in FIG. 5a.

As already explained above when discussing the conversion file CF illustrated in FIG. 5a-5b and FIG. 6a-6d, the conversion file comprises an association for the Internet service between the identified function and one or more states of the state-machine. For illustrative purposes and by way of example, the DN 92 may determine in this step that the data packet corresponds to the state SENT-REQ CF-111 illustrated in FIG. 5b.

In an embodiment, the method may further comprise an optional step of identifying by the DN, in a conversion file applicable for the Internet service, a state-machine and one or more states of the state-machine, the state-machine and the one or more states being associated with the determined function for the Internet service.

Once the state has been determined, and with reference to FIG. 14, the method comprises a step S-380 of detecting in the classified data packet a token associated with the determined state in the conversion file for the Internet service.

To this end, the DN 92 may find a number of tokens CF-1111 such as, for example, 00011, 0011, 00101, 0000011, etc., which are associated in the conversion file CF with the state SENT-REQ CF-111 as illustrated in FIG. 5b. Then, by inspecting contents in the classified data packet, the DN 92 may detect in the classified data packet at least one of these tokens CF-1111.

Once a token has been detected in the classified data packet, the method comprises a step S-390 of decompressing the classified data packet by replacing the token detected in the classified data packet by a data pattern associated with the detected token in the conversion file for the Internet service. That is, following with the exemplary case of detecting at least one of tokens CF-1111, the DN 92 may replace the at least one token by a respective data pattern CF-1110 associated in the conversion file CF with the token. For example, if the DN 92 had detected the tokens 00101 and 0000011, the DN 92 would decompress the data packet by replacing such tokens by respective data patterns ACCEPT and KEEP-ALIVE.

That is, by using shorter tokens, fewer bits, for data patterns more frequently used, the compression method can advantageously reach higher compression rates and the decompression method can decompress data packets with higher compression rates without increasing the processor load and without decreasing performance.

The method illustrated with reference to FIG. 14 can be carried out by the DN 92 illustrated in FIG. 17. This DN comprises at least one processor 9215, and a memory 9210 comprising instructions executable by the at least one processor, whereby the DN is configured to classify a data packet as related to an Internet service, to determine a function that the classified data packet is intended to accomplish for the Internet service, and to determine a state that corresponds to the classified data packet, based on a state-machine CF-110 and one or more states CF-111 of the state-machine. The state-machine CF-110 and the one or more states CF-111 are associated with the determined function CF-11 in a conversion file CF-1 applicable for the Internet service. The DN is also configured to detect in the classified data packet a token CF-1111 associated with the determined state CF-111 in the conversion file CF-1 for the Internet service, and to decompress the classified data packet by replacing the token CF-1111 detected in the classified data packet by a data pattern CF-1110 associated with the detected token CF-1111 in the conversion file CF-1 for the Internet service.

The above methods described with reference to FIG. 13 and FIG. 14 are advantageous where the conversion file is static, in terms of maintaining a fixed number of data patterns and associated tokens, and are also advantageous where the conversion file is dynamic, in terms of allowing addition of new data patterns and associated new tokens on run-time.

In particular, where the conversion file is static, both CN 91 and DN 92 may be configured with, at least, a portion CF-1 of the conversion file CF, as illustrated in FIG. 5*a*-5*b*. The at least portion of the conversion file is applicable for an Internet service, such as HTTP protocol, and comprises an association between at least one function, such as CF-11, for the Internet service and a respective state-machine, such as CF-110, and an association between the least one function, such as CF-11, and at least one state, such as CF-111 and CF-112, of the state-machine CF-110 for the function. Apart from this, the at least one state, such as CF-111, is associated with one or more data patterns CF-1110, and the one or more data patterns are associated with respective one or more tokens CF-1111. For compression and decompression purposes, the one or more data patterns CF-1110 and the respective one or more associated tokens CF-1111 are replaceable by one another during said compression and decompression.

When both CN 91 and DN 92 are configured with a static conversion file, it may be desirable to configure a static conversion file valid for more than one Internet service, as explained above when discussing the contents of the conversion file with reference to FIG. 5*a*-5*b* and FIG. 6*a*-6*d*.

In principle, in embodiments in which both CN 91 and DN 92 are configured with the static conversion file valid for more than one Internet service, there is no need to have additional nodes participating in the compression and decompression methods.

Nevertheless, in order to configure the CN 91 and DN 92 before or during the setup of the CN and the DN, the method for compressing and the method for decompressing may include a respective step of receiving the at least portion of the conversion file from at least one of: an Operation and Maintenance System (OMS) of the telecommunication network, a Provisioning System of the telecommunication network, and a Service Provider server that provides a compression service.

The at least portion of the conversion file is applicable for the Internet service and comprises an association between at least one function for the Internet service and a respective state-machine for the at least one function, and an association between the least one function and at least one state of the state-machine. Particularly in the method for compressing data packets, the at least one state is associated with at least one data pattern detectable during compression, and the at least one data pattern is associated with a respective token to replace the data pattern during compression. Particularly in the method for decompressing data packets, the at least one state is associated with at least one token detectable during decompression, and the at least one token is associated with a respective data pattern to replace the token during decompression.

The present specification, however, also provides for other embodiments where participation of an additional node for controlling at least one of compression and decompression of data packets is advantageous. For instance, as explained above, in a case in which the conversion file is dynamic, in terms of allowing additions of new data patterns and new tokens on run-time, the participation of the additional node is advantageous to receive the new data patterns and new tokens from a CN and to distribute them to one or more DN.

The handling of a dynamic conversion file will be further described but, for the time being, one can simply assume that, if the CN 91 were enabled to add new data patterns and new respective tokens into the conversion file on run-time, the DN 92 should be aware of these additions; otherwise, the DN would not be capable of decompressing the data packet.

In one embodiment of the invention, not illustrated in any drawing, the CN 91 may be enabled to send information about the new data patterns and respective new tokens to the DN 92.

However, in scenarios where more than one CN exists, such as in networks with more than one PCEF device or when a plurality of UEs include respective CNs, the participation of an additional node is advantageous in order to hold and maintain a sort of master conversion file, wherein any additions by different CNs can be updated, and in order to submit an updated conversion file to all the DNs participating in this scenario.

Moreover, since the conversion file may apply for more than one Internet service, there might be Internet services for which a static portion of the conversion file is advantageous, whereas there might be other Internet services for which a dynamic portion of the conversion file is more advantageous.

The present specification provides for embodiments wherein such additional node, namely the PCN, is provided for controlling at least one of compression and decompression of data packets.

In other words, there is a great advantage on simultaneously supporting portions of the conversion file applicable to corresponding Internet services, wherein at least one portion, applicable for an Internet service, is static and may be configured at each CN and DN, and wherein at least one portion, applicable for other Internet service, is dynamic and may be configured at the PCN and distributed to the CNs and DNs from the PCN. Of course, the whole conversion file applicable for a number of Internet services may be completely configured at the PCN and distributed to the CNs and DNs, independently on whether all, some or none of the Internet services allow for dynamic additions of new data patterns and new tokens.

Moreover, the existence of the PCN for controlling at least one of compression and decompression of data packets is also advantageous to centralize the handling of the RF values commented above in order to ensure that the most frequently replaced data patterns are associated with shorter tokens. This feature can hardly be achieved where there is no central entity, such as the PCN, for controlling at least one of compression and decompression of data packets.

That is, even if a dynamic conversion file is not required at all, for the purpose of adding new data patterns and new tokens, the PCN for controlling at least one of compression and decompression of data packets is still advantageous in order to support a proper re-assignment of shorter tokens to more frequently replaced data patterns, at least, from time to time.

Thus, FIG. 15 illustrates a method for controlling at least one of compression and decompression of data packets, the method being performed by the PCN.

As illustrated in FIG. 15, and with due regard to FIG. 6*a*-6*d*, this method comprises a step S-400 of configuring the PCN with, at least, a portion CF-2 of the conversion file CF, as illustrated in FIG. 6*a*-6*d*. The at least portion is applicable for an Internet service, such as SKYPE protocol, and comprises an association between at least one function, such as CF-21 and CF-22, for the Internet service and a respective state-machine, such as CF-210 and CF-220, for the at least one function CF-21 and CF-22, and an association between the least one function, such as CF-21, and at least one state, such as CF-211 and CF-212, of the state-machine CF-210 for the function. Apart from this, the at least one state, such as CF-211, is associated with one or more data patterns CF-2110, and the one or more data patterns are associated with respective one or more tokens CF-2111. For compression and decompression purposes, the one or more data patterns CF-2110 and the respective one or more associated tokens CF-2111 are replaceable by one another during said compression and decompression.

This method illustrated in FIG. 15 also comprises a step S-410 of sending the at least portion CF-2 of the conversion file to at least one of CN 91 and the DN 92. The at least portion of the conversion file is to be understood as covering anyone of: sending only a portion of the conversion file, the portion applying to a particular Internet service; sending the whole conversion file, which applies only to the particular Internet service; and sending the whole conversion file, which applies to the particular Internet service and more Internet services.

Correspondingly with the step S-410 of sending the at least portion of the conversion file to at least one of CN 91 and the DN 92, the method for compressing a data packet by the CN and the method for decompressing a data packet by the DN include a step of receiving the at least portion of the conversion file. This step of receiving the at least portion of the conversion file will be further commented when discussing the methods for compressing and decompressing under other particular embodiments in different scenarios.

The method illustrated with reference to FIG. 15 can be carried out by the PCN 11 illustrated in FIG. 18. This PCN comprises at least one processor 1115, a transmitter 1120 and a memory 1110 comprising instructions executable by the at least one processor, whereby the PCN is configured to configure at least a portion CF-2 of a conversion file CF. The at least portion is applicable for an Internet service and comprises an association between at least one function, such as CF-21 and CF-22, for the Internet service and a respective state-machine, such as CF-210 and CF-220, and an association between the least one function CF-21 and at least one state, such as CF-211 and CF-212, of the state-machine CF-210 for the function. The at least one state CF-211 is associated with at least one data pattern CF-2110, the at least one data pattern is associated with a respective token CF-2111, and the at least one data pattern CF-2110 and the associated token CF-2111 are replaceable by one another during compression and decompression. The PCN is also configured to send the at least portion CF-2 of the conversion file to at least one of a compression node 91 and a decompression node 92.

In an embodiment illustrated in FIG. 15, the method in the PCN, for controlling at least one of compression and decompression of data packets, might include a step S-430 of receiving from the compression node at least an updated portion of the conversion file with one or more RF values for respective one or more replaced data patterns, and a step S-450 of replacing, for each data pattern in the conversion file, the associated token by a new associated token, wherein the new associated token is selected with a length depending on the RF value associated with the data pattern, and wherein shorter tokens are selected for higher RF values. In a particular embodiment, the new associated tokens may correspond to a different distribution of the previously associated tokens per data pattern, without needing new tokens which were not used before in the conversion file. In other embodiment, the new associated tokens may include one or more new tokens which were not used before in the conversion file.

In an embodiment illustrated in FIG. 15, this method in the PCN might include a step S-440 of receiving from the compression node at least an updated portion of the conversion file with one or more new data patterns determined in the data packet and one or more new tokens respectively generated for the one or more new data patterns.

The purpose and achievement of these optional steps in FIG. 15 have been mentioned above and will be further commented under the particular embodiments to be discussed in the following.

FIG. 3*a*-3*b* respectively illustrate a method for compressing data packets and a method for decompressing data packets in accordance with an embodiment of the invention, wherein the conversion file is static, in the sense that new data patterns and new tokens are not allowed to be added on run-time, but is dynamic in the sense that allows for re-assigning new associated tokens to keep the most frequently replaced data patterns associated with shorter tokens.

Under this embodiment, the data packets to be compressed may be uplink traffic packets from a UE, the CN 91 is included in a first PCEF node 21, the DN 92 is included in a second PCEF node 22, and a PCRF node 1 acts as the PCN 11, in accordance with the scenario commented above with reference to FIG. 2.

The sequence of actions illustrated in FIG. 3*a* starts with the submission of a control session request, e.g. for the first UE 81, from the first PCEF node 21 to the PCRF node 1, during a step S-100. The PCRF node submits a corresponding control session answer to the first PCEF node during a step S-110.

More or less simultaneously with, or at least close in time to, the control session request from the first PCEF node, the PCRF node 1 receives during a step S-105 a control session request, e.g. for the second UE 82, from the second PCEF node 22, and the PCRF node submits a corresponding control session answer to the second PCEF node during a step S-115.

The control session answer respectively submitted to both first PCEF node 21 and second PCEF node 22, may include the whole conversion file or, at least, a portion of the conversion file applicable to a specific Internet service. That is, in this embodiment, the method for compressing data packets comprises receiving at least a portion of the conversion file at the CN 91 during step S-110 and the method for decompressing data packets comprises receiving at least a portion of the conversion file at the DN 92 during step S-115. These steps S-110 and S-115 of receiving at least a portion of the conversion file at the CN and DN, are aligned with the step S-410 shown in FIG. 15 of sending the at least portion of the conversion file from the PCN to at least one of CN 91 and the DN 92.

To this end, the CN 91 illustrated in FIG. 10 may comprise, apart from the memory 9110 and the processor 9115 already discussed above with reference to FIG. 16, a transmitter 9140 configured to submit the control session request to the PCRF node 1 and a receiver 9130 configured to receive the at least portion CF-1 of the conversion file; and the DN 92 illustrated in FIG. 11 may comprise, apart from the memory 9210 and the processor 9215 already discussed above with reference to FIG. 17, a transmitter 9240 configured to submit the control session request to the PCRF node 1 and a receiver 9230 configured to receive the at least portion CF-1 of the conversion file.

Also to this end, the PCN 1 illustrated in FIG. 12 may comprise, apart from the memory 1110, the transmitter 1120 and the processor 9115 already discussed above with reference to FIG. 18, a receiver 1130 configured to receive the control session requests from the first and second PCEF nodes.

This at least portion of the conversion file, received at the first PCEF node 21 and at the second PCEF node 22, is applicable for an Internet service and comprises an association between at least one function CF-11 for the Internet service and a respective state-machine CF-110 for the at least one function, and an association between the least one function CF-11 and at least one state CF-111 of the state-machine.

In particular for the first PCEF node that comprises the CN 91, the at least one state CF-111 is associated with at least one data pattern CF-1110 detectable during compression, and the at least one data pattern is associated with a respective token CF-1111 to replace the data pattern during compression.

In particular for the second PCEF node that comprises the DN 92, the at least one state CF-111 is associated with at least one token CF-1111 detectable during decompression, and the at least one token is associated with a respective data pattern CF-1110 to replace the token during decompression.

For the sake of simplicity, any further reference to the at least portion of the conversion file may hereinafter be simplified as a reference to the conversion file.

In addition, the control session answer respectively submitted to both first PCEF node 21 and second PCEF node 22, may also include a control policy for the UE indicating anyone of an Internet service which user traffic packets are subject of compression or decompression, and a compression rate. To this end, and not illustrated in any drawing, the PCRF node 1 may obtain such control policy for the UE from the SPR node 3 illustrated in FIG. 1. The control policy may be used to selectively apply compression and decompression to specific Internet services.

Again with reference to the sequence of actions illustrated in FIG. 3a, and once the control sessions have respectively been established between the PCRF node 1 and the first and second PCEF nodes 21 and 22, the first UE 81 starts submitting user traffic packets and a packet is received at the first PCEF node 21 during a step S-120.

To this end, the CN 91 illustrated in FIG. 10 may further comprise a second receiver 9150 configured to receive the packet submitted from the UE 81.

The first PCEF node 21 inspects the packet during a step S-125, likely with a DPI module embedded into the CN 91, and classifies the packet as belonging to the Internet service for which the conversion file applies. Then, the first PCEF node 21 inspects the packet during a step S-140 and determines a function to be accomplished by the packet.

Once the Internet service and the function have been identified from packet contents, the first PCEF node makes use of the received conversion file, and determines a state for the packet during a step S-145, the determination being based on states of the state-machine associated with the function for the Internet service in the conversion file.

Once the state has been determined, the first PCEF node inspects the packet during a step S-150 to detect data patterns associated in the conversion file with the determined state.

Then, the first PCEF 21 compresses the packet during a step S-155 by replacing detected data patterns by respective tokens associated in the conversion file with the detected data patterns.

Eventually, the compressed user traffic packet is submitted during a step S-160 to the telecommunications network.

To this end, the CN 91 illustrated in FIG. 10 may further comprise a second transmitter 9160 configured to submit the compressed packet towards the telecommunication network 10.

At this stage, the replacement of a data pattern by the associated token may be better described with reference to FIG. 8, especially, where the optional RF values are supported to keep track of the frequency of replacements for each data pattern.

FIG. 8 illustrates an exemplary association of data patterns CF-1110 with respective tokens CF-1111 and respective RF values CF-1112 included in an original portion of the conversion file received from the PCRF node, that is, from the PCN via the receiver 9130. During a step S-151, the CN 91 detects in the data packet the exemplary data pattern GET URL, and replaces in the data packet during a step S-152 the data pattern GET URL by the corresponding token 00011 associated in the conversion file with the exemplary data pattern GET URL.

Then, if the optional RF values are supported, the CN 91 updates during a step S-154 the RF value 2522 associated with the data pattern GET URL to a next value 2523 in the conversion file. In particular, the updating to a next value may be interpreted as increasing the RF value in one unit. However, since the DN 92 would further replace the token by the data pattern, one might think that this replacement should also be accounted. As an option, the RF values may be updated by both CN and DN, or just by the CN in a double number of units. Moreover, instead of increasing the RF value in one single unit, the RF value may be increased in a number of units depending on the difference between the length of the data pattern and the length of the token. Furthermore, if the RF values were coded as complement-to-2 notations, the updating may be also formulated as decreasing the current RF value. In summary and generally speaking, the CN 91 may update during a step S-154 the RF value CF-1112 associated with the data pattern GET URL to a next value in the conversion file.

Regarding the updating of RF values towards the PCN or the PCRF node 1, the present specification provides for different embodiments. In an embodiment, upon updating by the CN 91, during the step S-154, the RF value CF-1112 associated with the detected data pattern to a next value in the at least portion of the conversion file, the CN may send to the PCN the updated RF value CF-1112 and identification information related to the replaced data pattern. In particular, this identification information allows the PCN to identify the determined function and determined state associated with the determined function for the Internet protocol, so that the replaced data pattern associated with said determined state can be identified. In implementations where each particular data pattern in the conversion file can be identified by a unique reference, such as a pointer, the identification information may simply include such unique reference to the conversion file. The particular embodiment of sending identification information related to the replaced data pattern is especially useful where there is more than one CN handling a same at least portion of the conversion file, so that each more than one CN may be simultaneously updating a same RF value in a number of next values.

Alternatively or additionally, the CN may submit to the PCN the updated at least portion of the conversion file including updated and non-updated RF values. This alternative embodiment may be useful where there is just one CN handling a same at least portion of the conversion file, so that the PCN does not need updating the at least portion of the conversion file.

In a still further embodiment, the PCN does not submit the RF values in the at least portion of the conversion file. In this embodiment, upon replacing during the step S-152 the detected data pattern CF-1110 by the associated token CF-1111, the CN sends to the PCN the replaced data pattern and identification information related to the replaced data pattern. In a similar manner as before, the identification information allows the PCN to identify the replaced data patterns, with help of data identifying the determined function and determined state or with help of a unique reference to the replaced data pattern. Then, the PCN on its own can update the RF values associated with the replaced data patterns in accordance with indicated next values.

In order to update RF values towards the PCN, the transmitter 9140 of the CN 91 illustrated in FIG. 10 may further be configured to send each updated RF value and/or identification information related to each corresponding replaced data pattern to the PCRF 1 or, more generally speaking, to the PCN 11.

Correspondingly, the transmitter 1120 of the PCN 11 illustrated in FIG. 12 may further be configured to send to the CN 91 a RF value CF-1112 associated with each data pattern CF-1110 and the respective associated token CF-1111 in the at least portion of the conversion file, wherein the RF value indicates a frequency of previous replacements of the associated data pattern CF-1110 during compression; the receiver 1130 of the PCN 11 illustrated in FIG. 12 may further be configured to receive from the CN 91 an updated RF value and identification information related to the replaced data pattern CF-1110; and the processor 1115 of the PCN 11 illustrated in FIG. 12 may further be configured to identify, based on the identification information, the replaced data pattern CF-1110 in the at least portion of the conversion file, and to update the RF value CF-1112 associated with the replaced data pattern CF-1110 to a next value in the at least portion of the conversion file.

Again referring to the embodiment illustrated with reference to FIG. 3a-3b, the sequence of actions illustrated in FIG. 3b starts with the reception during a step S-160 of a compressed user traffic packet at the second PCEF node from the telecommunications network.

To this end, the DN 92 illustrated in FIG. 11 may further comprise a second receiver 9250 configured to receive the compressed packet from the telecommunication network 10.

The second PCEF node 22 inspects the packet during a step S-165, likely with a DPI module embedded into the DN 92, and classifies the packet as belonging to the Internet service for which the conversion file applies. Then, the second PCEF node 22 inspects the packet during a step S-180 and determines a function to be accomplished by the packet.

Once the Internet service and the function have been identified from packet contents, the second PCEF node makes use of the previously received conversion file, and determines a state for the packet during a step S-185, the determination being based on states of the state-machine associated with the function for the Internet service in the conversion file.

Once the state has been determined, the second PCEF node 22 inspects the packet during a step S-190 to detect tokens associated in the conversion file with the determined state.

Then, the second PCEF 22 decompresses the packet during a step S-195 by replacing the detected tokens by respective data patterns associated in the conversion file with the detected tokens.

Eventually, the decompressed user traffic packet is submitted during a step S-200 towards its destination, e.g. the second UE 82.

To this end, the DN 92 illustrated in FIG. 11 may further comprise a second transmitter 9260 configured to submit the decompressed packet towards the second UE 82.

The embodiment disclosed with reference to FIG. 3a-3b, wherein the conversion file is configured at both CN and DN, or respectively received by both CN and DN before having started the compression at the CN, is not advantageous for a CN enabled to determine or discover new data patterns in a data packet, not included in the conversion file, and to generate new corresponding tokens on run-time, simply because the DN would not know such new data patterns and new tokens, nor the associations.

However, in an embodiment illustrated in FIG. 4a-4b, the CN may determine or discover new data patterns in a data packet, not included in the conversion file, and may generate new corresponding tokens on run-time. This is especially useful to increase the compression rate.

For the purpose of the present specification, the term "new data pattern" (when determined or discovered at the CN) may particularly denote a further data pattern which is not currently associated with the determined state for the determined function of the Internet service in the conversion file. Likewise, the term "new token" (when generated at the CN) may particularly denote a further token which is not currently associated with the determined state for the determined function of the Internet service in the conversion file.

The embodiment illustrated in FIG. 4a-4b differs, from the one discussed above with reference to FIG. 3a-3b, on that the conversion file is received at different steps and, at both CN and DN, after having classified a data packet as belonging to the Internet service for which the conversion file applies. Moreover, the embodiment illustrated in FIG. 4a-4b applies to a CN 91, PCN 11 and DN 92, without an explicit involvement of PCC entities, so that this embodiment may apply to the CN 91, PCN 11 and DN 92 as standalone entities, or combined with any other entities.

In this respect, the same basic and optional structural elements of the CN, DN and PCN, which were already discussed with reference to FIG. 10-12 for the embodiment illustrated in FIG. 3a-3b, may also be applicable for the embodiment illustrated in FIG. 4a-4b.

The sequence of actions illustrated in FIG. 4a starts with the reception during a step S-121 of a data packet at the CN 91. Once the data packet has been inspected and classified as belonging to an Internet service during a step S-125, as for the embodiment shown in FIG. 3a-3b, in this embodiment the CN 91 may submit during a step S-130 a session request to the PCN 11 indicating the Internet service for which a conversion file is needed.

The PCN 11 sends and the CN receives during a step S-135 a session response including at least a portion of the conversion file. This at least portion CF-1 is applicable for the Internet service and comprises an association between at least one function CF-11 for the Internet service and a respective state-machine CF-110 for the at least one function, and an association between the least one function CF-11 and at least one state CF-111 of the state-machine, wherein the at least one state CF-111 is associated with at least one data pattern CF-1110 detectable during compression, and wherein the at least one data pattern is associated with a respective token CF-1111 to replace the data pattern during compression.

Then, once the at least portion of the conversion file for the Internet service has been received, the CN 91 may inspect the data packet during the step S-140 to determine a function to be accomplished by the data packet, and may determine a state for the data packet during a step S-145, based on the states CF-111 of the state-machine CF-110 associated with the determined function CF-11 in the received at least portion CF-1 of the conversion file.

The CN 91 may, then, inspect the data packet during a step S-150 to detect data patterns associated with the determined state in the received at least portion of the conversion file, and may compress the data packet during a step S-155 by replacing the detected data patterns by respective tokens associated with the detected data patterns in the received at least portion of the conversion file.

At this stage, the detection and replacement of new data patterns, which has been mentioned above and this embodiment supports, can be further discussed with reference to FIG. 9. Once the data packet has been compressed by replacing all data patterns detected in the data packet and which were associated with the determined state, the CN 91 can follow the flow of actions illustrated in FIG. 9 to further compress the data packet. This might be required, for example, if the CN determines that a desired compression rate, which was indicated from the PCN as part of a control policy, has not been reached during the compression carried out during the step S-155.

As shown in FIG. 9, the CN 91 may determine during a step S-156*a* one or more new data patterns in the data packet and which are not included in the received at least portion of the conversion file. Then, the CN may generate during a step S-156*b* respective one or more new tokens for the one or more new data patterns, and may further compress the data packet during a step S-156*c* by replacing the one or more new data patterns by the respective one or more new tokens.

In a further embodiment, which is particularly applicable to the embodiment of detecting new data patterns and replacement of the new data patterns by the new tokens generated by the CN, the CN may determine that at least one amongst the new data patterns corresponds to an identification of a file, as illustrated in FIG. 9. An exemplary identification of a file might be an URL reference to a video file or audio file in YouTube or wherever else, or any other addressable file.

Upon determining by the CN a new data pattern that corresponds to an identification of a file, the CN may send during a step S-157*a* to a cache file server 93, hereinafter CFS, the identification of the file and the new token. Then, the CN may update during a step S-158*b* the at least portion CF-1 of the conversion file CF by associating a reference to the CFS, instead of the new data pattern, and the new token with the determined state CF-111 in the at least portion of the conversion file. Eventually, the CN may send during a step S-159 to the PCN the reference to the CFS, instead of the new data pattern, the new token and identification information related to the new data pattern. In particular, a reference to the CFS may be an addressable identifier of the CFS, or any other indication that the DN 92 could use to determine that the new data pattern is an identification of a file to be fetched from the CFS.

The CSF 93 may check its current contents and may determine whether the identification of the file is already stored therein or not. If the identification of the file is already stored in the CFS and associated with a previous token, the CFS ignores the new token submitted with the identification of the file and returns to the CN the identification of the file along with the previous token already associated in the CFS with the identification of the file. The CN, receiving this previous token, replaces the generated new token by the received previous token. However, if the identification of the file is not stored in the CFS, the CFS stores the received identification of the file associated with the received new token and returns a successful result back to the CN.

To this end, the CN 91 illustrated in FIG. 10 may further comprise a third transmitter 9180 configured to send to the CFS 93 the identification of the file and the new token, and a third receiver 9170 configured to receive the identification of the file and the previous token.

In an alternative embodiment illustrated in FIG. 19, upon determining by the CN 91 a new data pattern that corresponds to an identification of a file, the CN may send to the CFS 93 during a step S-157*b* the identification of the file to query whether the identification of the file is already stored in the CFS. The CFS may find during a step S-157*c* the identification of the file and a new token already associated at the CFS with the identification of the file, and may submit to the CN during a step S-157*d* the new token. The CN may thus receive during the step S-157*d* from the CFS the new token for the identification of the file, and the CN may update the at least portion CF-1 of the conversion file CF by associating a reference to the CFS, instead of the new data pattern, and the new token received from the CFS with the determined state CF-111 in the at least portion of the conversion file, as done in the previous embodiment with reference to FIG. 9. Eventually, the CN may send to the PCN the reference to the CFS, instead of the new data pattern, the new token and identification information related to the new data pattern. In particular, as explained above, a reference to the CFS may be an addressable identifier of the CFS, or any other indication that the DN 92 could use to determine that the new data pattern is an identification of a file to be fetched from the CFS.

To this end, the CN 91 illustrated in FIG. 10 may further comprise the third transmitter 9180 configured to send to the CFS 93 the identification of the file, and the third receiver 9170 configured to receive from the CFS 93 the new token associated with the identification of the file.

Of course, for those new data patterns not determined to correspond an identification of the file, the CN simply updates during a step S-158*a* the at least portion of the conversion file by associating the new data pattern and the new token with the determined state CF-111 in the at least portion of the conversion file. Then, the CN sends during the step S-159 to the PCN the new data pattern, the new token and identification information related to the new data pattern.

In particular, the identification information allows the PCN to identify the determined function CF-11 and determined state CF-111 associated with the determined function for the Internet protocol; and to associate the new data pattern, or the reference to the CFS, and the new token with said determined state CF-111.

To this end, the transmitter 9140 of the CN illustrated in FIG. 10 may further be configured to send to the PCN the new data pattern or the reference to the CFS, the new token and identification information related to the new data pattern.

Correspondingly, the receiver 1130 of the PCN illustrated in FIG. 12 may further be configured to receive from the CN the new data pattern, the new token and the identification information related to the new data pattern. The processor 1115 of the PCN illustrated in FIG. 12 may further be configured to identify, based on the identification information, a state associated with a function for the Internet service in the at least portion of the conversion file, and to associate the new data pattern and the new token with the identified state in the at least portion of the conversion file.

In addition, the embodiments explained above in respect of updating RF values, with reference to methods shown in FIG. 3*a*-3*b*, are also applicable to the methods shown in FIG. 4*a*-4*b* and may preferably be carried out before attempting a further compression of the data packets by replacement of the new data patterns by the new tokens.

Again referring to the embodiment illustrated in FIG. 4*a*-4*b*, after having completed the compression of the data packet, likely with new data patterns and new tokens, and likely after having managed the RF values, the compressed data packet is submitted during a step S-161 towards the telecommunications network, as illustrated in FIG. 4*a*.

The sequence of actions illustrated in FIG. 4*b* starts with the reception during a step S-161 of a compressed data packet at the DN 92 from the telecommunications network.

The DN 92 inspects the data packet during a step S-165, likely with a DPI module embedded into the DN 92, and classifies the data packet as belonging to the Internet service for which the conversion file applies. The DN 92 may send during a step S-170 a session request to the PCN 11 indicating the Internet service for which a conversion file is needed.

The PCN 11 sends and the DN receives during a step S-175 a session response including the at least a portion of the conversion file, as sufficiently discussed above. The at least portion of the conversion file received at the DN may thus comprise any new data patterns and associated new tokens that the CN might have used to further compress the data packet. This embodiment, where the DN obtains the at least portion of the conversion file after the CN has completed the compression, allows the support and handling of dynamic conversion files, dynamic in the sense of including new data patterns and new tokens not originally configured in the conversion file.

Then, the DN 92 inspects the data packet during a step S-180 and determines a function to be accomplished by the packet.

Once the Internet service and the function have been identified from packet contents, the DN makes use of the conversion file received during the step S-175, and determines a state for the data packet during a step S-185, the determination being based on states of the state-machine associated with the function for the Internet service in the conversion file.

Once the state has been determined, the DN 92 inspects the data packet during a step S-190 in order to detect in the data packet one or more tokens associated in the conversion file with the determined state.

For any detected token which is associated in the conversion file with a reference to the CFS 93, the DN 92 sends a file request to the CFS with the detected token, and receives from the CFS an identification of a file to be considered the data pattern associated with the detected token in the conversion file.

To this end, the DN 92 illustrated in FIG. 11 may further comprise a third transmitter 9280 configured to send to the CFS 93 the new token, and a third receiver 9270 configured to receive the identification of the file.

Then, the DN 92 decompresses the data packet during a step S-195 by replacing the detected tokens by respective data patterns associated in the conversion file with the detected tokens.

Eventually, the decompressed data packet is submitted during a step S-201 towards its destination.

Additionally to some embodiments commented above, such as those illustrated in FIG. 3*a*-3*b* and FIG. 4*a*-4*b*, in a further optional embodiment the CN 91 and DN 92, upon identifying that the state determined during the step S-145 corresponds to an entry state of the state-machine, may generate a context identifier indicating all relevant data to identify subsequent data packets belonging to the Internet service and to be compressed.

In particular, this context identifier may serve to identify certain headers in a first data packet and in subsequent data packets, which remain unchanged in the same flow. Thereby, when compressing a data packet, the CN may add the context identifier to the data packet. For example, FIG. 7 shows a context identifier 1004, which may be also understood as a Virtual Private Network, hereinafter VPN, tunnel identifier, the context identifier followed by an IP packet layer 1005, and both added next to a user application packet layer 1001, a user TCP packet layer 1002 and user IP packet layer 1003.

In an embodiment of the invention, where the determined state corresponds to the entry state of the state-machine, the CN may simply add the context identifier and submit the data packet without compression. This serves the DN to identify the context identifier and also all relevant data necessary to identify subsequently compressed data packets.

Further embodiments of the CN, DN and PCN are described in the following.

An alternative and/or additional CN 91 for compressing data packets may comprise a memory 9110 configured to store at least a portion of a conversion file. The at least portion of the conversion file is applicable for an Internet service and includes one or more functions of the Internet service, the one or more functions associated with respective state-machines, wherein a state of a state-machine is associated with one or more data patterns detectable during compression and wherein each data pattern is associated with a token to replace the data pattern during compression.

This CN may comprise a processor 9115 configured to classify a data packet as related to an Internet service, to determine a function that the classified data packet is intended to accomplish for the Internet service, and to determine a state that corresponds to the classified data packet, the determination being based on a state-machine and one or more states of the state-machine. The state-machine and the one or more states are associated with the determined function in the at least portion of the conversion file applicable for the Internet service. The processor 9115 is also configured to detect in the classified data packet a data pattern associated with the determined state in the at least portion of the conversion file for the Internet service, and to compress the classified data packet by replacing the data pattern detected in the classified data packet by a token associated with the detected data pattern in the at least portion of the conversion file for the Internet service.

This CN 91 may further comprise a receiver 9150 configured to receive the data packet. This CN may further comprise a deep packet inspection, hereinafter DPI, module 9120 configured to inspect the data packet. This CN may further comprise a transmitter 9160 configured to submit the compressed data packet to the telecommunications network.

An alternative and/or additional DN 92 for decompressing data packets may comprise a memory 9210 configured to store at least a portion of a conversion file. The at least portion of the conversion file is applicable for an Internet service and includes one or more functions of the Internet service, the one or more functions associated with respective state-machines, wherein a state of a state-machine is associated with one or more tokens detectable during decompression and wherein each token is associated with a data pattern to replace the token during decompression.

This DN may comprise a processor 9215 configured to classify a data packet as related to an Internet service, to determine a function that the classified data packet is intended to accomplish for the Internet service, and to determine a state that corresponds to the classified data packet, the determination being based on a state-machine and one or more states of the state-machine. The state-machine and the one or more states are associated with the determined function in the at least portion of the conversion file applicable for the Internet service. The processor 9215 is also configured to detect in the classified data packet a token associated with the determined state in the at least portion of the conversion file for the Internet service, and to decompress the classified data packet by replacing the token detected in the classified data packet by a data pattern associated with the detected token in the at least portion of the conversion file for the Internet service.

This DN may further comprise a receiver 9250 configured to receive the data packet from the telecommunication network. This DN may further comprise a deep packet inspection, hereinafter DPI, module 9220 configured to inspect the data packet. This DN may further comprise a transmitter 9260 configured to submit the decompressed data packet.

An alternative and/or additional PCN 11 for controlling at least one of compression and decompression of data packets may comprise a memory 1110 configured to store at least a portion of a conversion file. The at least portion of the conversion file is applicable for an Internet service and comprises an association between at least one function for the Internet service and a respective state-machine, and an association between the least one function and at least one state of the state-machine for the function, wherein the at least one state is associated with at least one data pattern, wherein the at least one data pattern is associated with a respective token, and wherein the at least one data pattern and the associated token are replaceable by one another during compression and decompression.

This PCN may comprise a processor 1115 configured to determine the submission of the at least portion of the conversion file towards at least one of a compression node and a decompression node, and a transmitter 1120 configured to send the at least portion of the conversion file to the at least one of the compression node and the decompression node.

This PCN 11 may further comprise a receiver 1130 configured to receive the control session requests from the CN 91 and/or DN 92. This PCN 11 may comprise in addition to the receiver 1130 one or more further receivers implementing the functionalities related to receiving, for example, the identification information related to replaced data patterns, updated RF values, and/or the identification information related to new data patterns and corresponding new tokens. Likewise, the PCN 11 may comprise in addition to the transmitter 1120 one or more further transmitters implementing the functionalities related to transmitting, for example, RF values associated with respective data patterns and respective tokens in the at least portion of the conversion file, and/or the control policies. One or more of these receivers and on or more of these transmitters may be implemented in one or more transceivers.

In other embodiments explained in the following, the present specification also provides for enhanced elements or alternative elements that may improve or facilitate the implementation of the CN 91 and DN 92.

For example, anyone of CN and DN, or both, may include a respective DPI module 9120 and 9220 in order to alleviate the processor on inspecting the data packets.

Also for example, the receiver 9130 and transmitter 9140 of the CN 91 may be implemented in a transceiver 9135, which allows the receiver and transmitter sharing a common circuitry or, at least, a single housing. Accordingly, the CN 91 may only comprise the transceiver 9135. Likewise, a second transceiver 9155 may replace the second receiver 9150 and second transmitter 9160, and a third transceiver 9175 may replace the third receiver 9170 and third transmitter 9180 of the CN illustrated in FIG. 10. Moreover, one of the receivers 9130, 9150, 9170 may implement the functionalities of one or of both respective other receivers 9130, 9150, 9170, and/or one of the transmitters 9140, 9160, 9180 may implement the functionalities of one or of both respective other transmitters 9140, 9160, 9180. The CN 91 may also comprise only one transceiver implementing the functionalities of the first, second and third transceivers 9135, 9155, 9175.

Also for example, and not necessarily aligned with the implementation for the CN, the receiver 9230 and transmitter 9240 of the DN 92 may be implemented in a transceiver 9235, which allows the receiver and transmitter sharing a common circuitry or, at least, a single housing. Accordingly, the DN 92 may only comprise the transceiver 9235. Likewise, a second transceiver 9255 may replace the second receiver 9250 and second transmitter 9260, and a third transceiver 9275 may replace the third receiver 9270 and third transmitter 9280 of the DN illustrated in FIG. 11. Moreover, one of the receivers 9230, 9250, 9270 may implement the functionalities of one or of both respective other receivers 9230, 9250, 9270, and/or one of the transmitters 9240, 9260, 9280 may implement the functionalities of one or of both respective other transmitters 9240, 9260, 9280. The CN 91 may also comprise only one transceiver implementing the functionalities of the first, second and third transceivers 9235, 9255, 9275.

The invention is described above in connection with various embodiments that are intended to be illustrative and non-restrictive. It is expected that those of ordinary skill in this art may modify these embodiments. The scope of the invention is defined by the claims in conjunction with the description and drawings, and all modifications that fall within the scope of the claims are intended to be included therein.

The invention claimed is:

1. A method for compressing data packets in a compression node (CN) of a telecommunication network, the method comprising:
    classifying a data packet as related to an Internet service;
    determining a function that the classified data packet is intended to accomplish for the Internet service;
    determining a state that corresponds to the classified data packet, based on a state-machine and at least one state of the state-machine, the state-machine and the at least one state being associated with the determined function in a conversion file (CF) applicable for the Internet service;

detecting in the classified data packet a data pattern associated with the determined state in the conversion file; and compressing the classified data packet by replacing the data pattern detected in the classified data packet with a token associated with the detected data pattern in the conversion file.

2. The method of claim 1, further comprising:
receiving at least a portion of the conversion file from at least one of:
an Operation and Maintenance System (OMS) of the telecommunication network;
Provisioning System of the telecommunication network; and
a Service Provider server that provides a compression service;
the at least portion being applicable for the Internet service and comprising an association between:
at least one function for the Internet service and a respective state-machine for the at least one function; and
the least one function and at least one state of the state-machine,
wherein the at least one state is associated with at least one data pattern detectable during compression, and wherein the at least one data pattern is associated with a respective token to replace the data pattern during compression.

3. The method of claim 1, further comprising:
receiving at least a portion of the conversion file from a policy control node (PCN) of the telecommunication network, the at least a portion being applicable for the Internet service and comprising an association between at least one function for the Internet service and a respective state-machine for the at least one function, and an association between the least one function and at least one state of the state-machine, wherein the at least one state is associated with at least one data pattern detectable during compression, and wherein the at least one data pattern is associated with a respective token to replace the data pattern during compression.

4. The method of claim 3, further comprising:
upon replacing the detected data pattern with the associated token, sending to the PCN identification information related to the replaced data pattern and usable by the PCN to update a replacement frequency (RF) value to a next value, wherein the RF value is associated with the replaced data pattern in the at least portion of the conversion file, and wherein the RF value indicates a frequency of previous replacements of the replaced data pattern during compression.

5. The method of claim 3, further comprising:
determining in the data packet a new data pattern which is not associated with the determined state in the at least portion of the conversion file;
generating, for the new data pattern, a new token, which is not associated with the determined state in the at least portion of the conversion file; and
further compressing the data packet by replacing the new data pattern with the new token.

6. The method of claim 5, further comprising:
if the new data pattern corresponds to an identification of a file:
sending, to a cache file server (CFS), the identification of the file and the new token; and
sending, to the PCN, a reference to the CFS instead of the new data pattern, the new token and identification information related to the new data pattern; and
else:
sending, to the PCN, the new data pattern, the new token and identification information related to the new data pattern.

7. The method of claim 5, further comprising:
if the new data pattern corresponds to an identification of a file:
sending, to a cache file server (CFS), the identification of the file;
receiving, from the CFS, a new token associated with the identification of the file at the CFS; and
sending, to the PCN, a reference to the CFS instead of the new data pattern, the new token and identification information related to the new data pattern; and
else:
sending, to the PCN, the new data pattern, the new token and identification information related to the new data pattern.

8. The method of claim 1, further comprising:
receiving, from the PCN, a control policy indicating at least one of an Internet service whose associated data packets are subject of compression, and a compression rate.

9. A method in a policy control node (PCN) of a telecommunication network for controlling at least one of compression and decompression of data packets, the method comprising:
configuring at least a portion of a conversion file (CF), the at least a portion being applicable for an Internet service and comprising an association between at least one function for the Internet service and a respective state-machine, and an association between the least one function and at least one state of the state-machine for the function, the at least one state being associated with at least one data pattern, the at least one data pattern being associated with a respective token, and the at least one data pattern and the associated token are replaceable by one another during compression and decompression; and
sending the at least portion of the conversion file to at least one of a compression node and a decompression node.

10. The method of claim 9, further comprising:
receiving, from the compression node, identification information related to a replaced data pattern;
identifying, based on the identification information, the replaced data pattern in the at least portion of the conversion file; and
updating a replacement frequency (RF) value to a next value, wherein the RF value is associated with the replaced data pattern in the at least portion of the conversion file, and wherein the RF value indicates a frequency of previous replacements of the replaced data pattern during compression.

11. The method of claim 10, further comprising, for each data pattern in the at least portion of the conversion file, replacing the associated token with a new associated token, wherein the new associated token is selected with a length depending on the RF value associated with the data pattern, and wherein shorter tokens are selected for higher RF values.

12. The method of claim 9, further comprising:
receiving, from the compression node, a new data pattern, a new token and identification information related to the new data pattern;
identifying, based on the identification information, a state associated with a function for the Internet service in the at least portion of the conversion file; and
associating the new data pattern and the new token with the identified state in the at least a portion of the conversion file.

13. The method of claim 9, further comprising:
sending a control policy to the at least one of the compression node and the decompression node, the control policy indicating one of:
an Internet service which data packets are subject of one of compression and decompression; and
a compression rate.

14. A method for decompressing data packets in a decompression node (DN) of a telecommunication network, the method comprising:
classifying a data packet as related to an Internet service;
determining a function that the classified data packet is intended to accomplish for the Internet service;
determining a state that corresponds to the classified data packet, based on a state-machine and at least one state of the state-machine, the state-machine and the at least one state being associated with the determined function in a conversion file (CF) applicable for the Internet service;
detecting in the classified data packet a token associated with the determined state in the conversion file; and
decompressing the classified data packet by replacing the token detected in the classified data packet by a data pattern associated with the detected token in the conversion file.

15. The method of claim 14, further comprising:
receiving at least a portion of the conversion file from at least one of:
an Operation and Maintenance System (OMS) of the telecommunication network;
a Provisioning System of the telecommunication network; and
a Service Provider server that provides a decompression service;
the at least portion being applicable for the Internet service and comprising an association between:
at least one function for the Internet service and a respective state-machine for the at least one function; and
the least one function and at least one state of the state-machine,
wherein the at least one state is associated with at least one token detectable during decompression, and wherein the at least one token is associated with a respective data pattern to replace the token during decompression.

16. The method of claim 14, further comprising:
receiving at least a portion of the conversion file from a policy control node (PCN) of the telecommunication network, the at least a portion being applicable for the Internet service and comprising an association between at least one function for the Internet service and a respective state-machine for the at least one function, and an association between the least one function and at least one state of the state-machine, wherein the at least one state is associated with at least one token detectable during decompression, and wherein the at least one token is associated with a respective data pattern to replace the token during decompression.

17. The method of claim 16, wherein the token detected in the data packet is associated with a reference to a cache file server (CFS) in the at least portion of the conversion file, and the method further comprises:
sending the detected token to the CFS; and
receiving from the CFS an identification of a file to be considered the data pattern associated with the token in the at least portion of the conversion file.

18. The method of claim 14, further comprising:
receiving from the PCN a control policy indicating at least one of an Internet service which data packets are subject of decompression and a compression rate.

19. A compression node (CN) for compressing data packets in a telecommunication network, the CN comprising:
at least one processor, and
a memory comprising instructions executable by the at least one processor;
the processor being configured by the executable instructions to configure the CN to:
classify a data packet as related to an Internet service;
determine a function that the classified data packet is intended to accomplish for the Internet service;
determine a state that corresponds to the classified data packet, based on a state-machine and at least one state of the state-machine, the state-machine and the at least one state being associated with the determined function in a conversion file (CF) applicable for the Internet service;
detect in the classified data packet a data pattern associated with the determined state in the conversion file; and
compress the classified data packet by replacing the data pattern detected in the classified data packet by a token associated with the detected data pattern in the conversion file.

20. The CN of claim 19, further comprising:
at least one receiver;
whereby the CN is further configured to:
receive, via the at least one receiver, at least a portion of the conversion file from a policy control node (PCN) of the telecommunication network, the at least portion being applicable for the Internet service and comprising an association between at least one function for the Internet service and a respective state-machine for the at least one function, and an association between the least one function and at least one state of the state-machine, wherein the at least one state is associated with at least one data pattern detectable during compression, and wherein the at least one data pattern is associated with a respective token to replace the data pattern during compression.

21. The CN of claim 20, further comprising:
at least one transmitter;
whereby the CN is further configured to:
send, via the at least one transmitter to the PCN, upon replacement of the detected data pattern by the associated token, identification information related to the replaced data pattern and usable by the PCN to update a replacement frequency (RF) value to a next value, wherein the RF value is associated with the replaced data pattern in the at least portion of the conversion file, and wherein the RF value indicates a frequency of previous replacements of the replaced data pattern during compression.

22. The CN of claim 20, further configured to:
determine, in the data packet, a new data pattern which is not associated with the determined state in the at least portion of the conversion file;
generate, for the new data pattern, a new token, which is not associated with the determined state in the at least portion of the conversion file; and
further compress the data packet by replacing the new data pattern by the new token.

23. The CN of claim 22, further configured to:
if the new data pattern corresponds to an identification of a file;
 send, via the at least one transmitter to a cache file server (CFS), the identification of the file and the new token; and
 send, via the at least one transmitter to the PCN, a reference to the CFS, instead of the new data pattern;
else;
 send, via the at least one transmitter to the PCN, the new data pattern, the new token and identification information related to the new data pattern.

24. The CN of claim 22, further configured to:
if the new data pattern corresponds to an identification of a file;
 send, via the at least one transmitter to a cache file server (CFS), the identification of the file;
 receive, via the at least one receiver from the CFS, a new token associated with the identification of the file at the CFS; and
 send, via the at least one transmitter to the PCN, a reference to the CFS, instead of the new data pattern, the new token and identification information related to the new data pattern;
else;
 send, via the at least one transmitter to the PCN, the new data pattern, the new token and identification information related to the new data pattern.

25. A policy control node (PCN) for controlling at least one of compression and decompression of data packets in a telecommunication network, the PCN comprising:
at least one processor,
at least one transmitter, and
a memory comprising instructions executable by the at least one processor;
the processor being configured by the executable instructions to configure the PCN to:
 configure at least a portion of a conversion file (CF), the at least a portion being applicable for an Internet service and comprising an association between at least one function for the Internet service and a respective state-machine, and an association between the least one function and at least one state of the state-machine for the function, the at least one state being associated with at least one data pattern, the at least one data pattern being associated with a respective token, and the at least one data pattern and the associated token are replaceable by one another during compression and decompression; and
send, via the at least one transmitter, the at least portion of the conversion file to at least one of a compression node and a decompression node.

26. The PCN of claim 25, further comprising:
at least one receiver;
whereby the PCN is further configured to:
 receive, via the at least one receiver from the compression node, identification information related to a replaced data pattern;
 identify, based on the identification information, the replaced data pattern in the at least portion of the conversion file; and
 update a replacement frequency (RF) value to a next value, wherein the RF value is associated with the replaced data pattern in the at least a portion of the conversion file, and wherein the RF value indicates a frequency of previous replacements of the replaced data pattern during compression.

27. The PCN of claim 26, further configured to replace, for each data pattern in the at least portion of the conversion file, the associated token with a new associated token, wherein the new associated token is selected with a length depending on the RF value associated with the data pattern, and wherein shorter tokens are selected for higher RF values.

28. The PCN of claim 25, further configured to:
receive, via the at least one receiver from the compression node, a new data pattern, a new token and identification information related to the new data pattern;
identify, based on the identification information, a state associated with a function for the Internet service in the at least portion of the conversion file; and
associate the new data pattern and the new token with the identified state in the at least portion of the conversion file.

29. The PCN of claim 25, further configured to:
send, via the at least one transmitter, a control policy to the at least one of the compression node and the decompression node, the control policy indicating one of:
 an Internet service which data packets are subject to one of compression and decompression; and
 a compression rate.

30. A decompression node (DN) for decompressing data packets in a telecommunication network, the DN comprising:
at least one processor, and
a memory comprising instructions executable by the at least one processor;
the processor being configured by the executable instructions to configure the DN to:
 classify a data packet as related to an Internet service;
 determine a function that the classified data packet is intended to accomplish for the Internet service;
 determine a state that corresponds to the classified data packet, based on a state-machine and at least one state of the state-machine, the state-machine and the at least one state being associated with the determined function in a conversion file (CF) applicable for the Internet service;
 detect in the classified data packet a token associated with the determined state in the conversion file; and
 decompress the classified data packet by replacing the token detected in the classified data packet by a data pattern associated with the detected token in the conversion file.

31. The DN of claim 30, further comprising:
at least one receiver;
whereby the DN is further configured to:
 receive, via the at least one receiver, at least a portion of the conversion file from a policy control node (PCN) of the telecommunication network, the at least portion being applicable for the Internet service and comprising an association between at least one function for the Internet service and a respective state-machine for the at least one function, and an association between the least one function and at least one state of the state-machine, wherein the at least one state is associated with at least one token detectable during decompression, and wherein the at least one token is associated with a respective data pattern to replace the token during decompression.

32. The DN of claim 31, wherein the token detected in the data packet is associated with a reference to a cache file server (CFS) in the at least portion of the conversion file, and the DN further comprises:
at least one transmitter, and
whereby the DN is further configured to:
send, via the at least one transmitter, the detected token to the CFS; and
receive, via the at least one receiver from the CFS, an identification of a file to be considered the data pattern associated with the token in the at least portion of the conversion file.

33. The DN of claim 30, further configured to:
receive, via the at least one receiver from the PCN, a control policy indicating at least one of an Internet service which data packets are subject of decompression and a compression rate.

34. The CN of claim 19, wherein the CN is included as part of a node for a telecommunications network, the node comprising a policy and charging enforcement function of a policy and charging control architecture.

35. The PCN of claim 25, wherein the PCN is included as part of a node for a telecommunications network, the node comprising a policy and charging rules function of a policy and charging control architecture.

36. The CN of claim 19, wherein the CN is included as part of a user equipment.

37. The DN of claim 30, wherein the DN is included as part of a node for a telecommunications network, the node comprising a policy and charging enforcement function of a policy and charging control architecture.

38. The DN of claim 30, wherein the DN is included as part of a user equipment.

* * * * *